(12) United States Patent  
Sato et al.

(10) Patent No.: US 11,899,478 B2  
(45) Date of Patent: Feb. 13, 2024

(54) SEMICONDUCTOR DEVICE, ELECTRONIC DEVICE, AND ARTIFICIAL SATELLITE

(71) Applicant: Semiconductor Energy Laboratory Co., Ltd., Atsugi (JP)

(72) Inventors: Keita Sato, Sagamihara (JP); Yuto Yakubo, Atsugi (JP); Yoshiaki Oikawa, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 317 days.

(21) Appl. No.: 17/298,695

(22) PCT Filed: Nov. 18, 2019

(86) PCT No.: PCT/IB2019/059860  
§ 371 (c)(1),  
(2) Date: Jun. 1, 2021

(87) PCT Pub. No.: WO2020/128673  
PCT Pub. Date: Jun. 25, 2020

(65) Prior Publication Data  
US 2022/0052663 A1 Feb. 17, 2022

(30) Foreign Application Priority Data  
Dec. 21, 2018 (JP) .................................. 2018-239966  
Jan. 18, 2019 (JP) .................................. 2019-006545

(51) Int. Cl.  
*G05F 1/56* (2006.01)  
*G05F 1/595* (2006.01)
(52) U.S. Cl.  
CPC ................ *G05F 1/56* (2013.01); *G05F 1/595* (2013.01)

(58) Field of Classification Search  
CPC .................................... G05F 1/56; G05F 1/595  
See application file for complete search history.

(56) References Cited

U.S. PATENT DOCUMENTS

| 8,363,374 B2 | 1/2013 | Martinelli |
| 8,736,371 B2 | 5/2014 | Ohnuki |

(Continued)

FOREIGN PATENT DOCUMENTS

| DE | 102013206284 | 10/2013 |
| JP | 11-224496 A | 8/1999 |

(Continued)

OTHER PUBLICATIONS

International Search Report (Application No. PCT/IB2019/059860) dated Jan. 28, 2020.

(Continued)

*Primary Examiner* — Jue Zhang  
*Assistant Examiner* — Lakaisha Jackson  
(74) *Attorney, Agent, or Firm* — Eric J. Robinson; Robinson Intellectual Property Law Office, P.C.

(57) ABSTRACT

A low-power semiconductor device is provided. A retention transistor is provided between a control circuit and an output transistor. An output terminal of the control circuit is electrically connected to one of a source and a drain of the retention transistor, and the other of the source and the drain of the retention transistor is electrically connected to a gate of the output transistor. A node to which the other of the source and the drain of the retention transistor and the gate of the output transistor are electrically connected is a retention node. When the retention transistor is in an on state, a potential corresponding to a potential output from the control circuit is written to the retention node. Then, when the retention transistor is in an off state, the potential of the retention node is retained. Thus, a gate potential of the (Continued)

output transistor can be kept at a constant value even when the control circuit is off. Accordingly, even when the control circuit is off, a constant potential can be continuously output from one of a source and a drain of the output transistor, for example.

12 Claims, 22 Drawing Sheets

(56) References Cited

U.S. PATENT DOCUMENTS

| | | | |
|---|---|---|---|
| 8,954,767 | B2 | 2/2015 | Gunther et al. |
| 9,195,247 | B2 | 11/2015 | Saito et al. |
| 9,374,048 | B2 | 6/2016 | Koyama et al. |
| 9,606,555 | B2 | 3/2017 | Saito et al. |
| 9,742,356 | B2 | 8/2017 | Takahashi et al. |
| 9,837,963 | B2 | 12/2017 | Koyama et al. |
| 10,560,056 | B2 | 2/2020 | Takahashi et al. |
| 2005/0134537 | A1 | 6/2005 | Tobita |
| 2009/0001955 | A1* | 1/2009 | Yoshida ............... H02M 3/158 323/282 |
| 2013/0271220 | A1 | 10/2013 | Takahashi et al. |
| 2017/0230041 | A1* | 8/2017 | Kato ..................... G11C 5/145 |
| 2019/0163220 | A1* | 5/2019 | Chen ...................... G05F 1/575 |
| 2020/0177132 | A1 | 6/2020 | Takahashi et al. |

FOREIGN PATENT DOCUMENTS

| | | | | |
|---|---|---|---|---|
| JP | 2003-029854 A | | 1/2003 | |
| JP | 2005-182494 A | | 7/2005 | |
| JP | 2009-032278 A | | 2/2009 | |
| JP | 2009032278 A | * | 2/2009 | ......... G11C 11/4074 |
| JP | 2012-130239 A | | 7/2012 | |
| JP | 2012-257212 A | | 12/2012 | |
| JP | 2013-235564 A | | 11/2013 | |
| JP | 2014-036543 A | | 2/2014 | |
| JP | 2015-062278 A | | 4/2015 | |
| KR | 2013-0115131 A | | 10/2013 | |
| WO | WO-2012/157463 | | 11/2012 | |

OTHER PUBLICATIONS

Written Opinion (Application No. PCT/IB2019/059860) dated Jan. 28, 2020.
Kunitake.H et al., "High thermal tolerance of 25-nm c-axis aligned crystalline In-Ga-Zn oxide FET", IEDM 18: Technical Digest of International Electron Devices Meeting, Dec. 1, 2018, pp. 312-315.

* cited by examiner

SEMICONDUCTOR DEVICE, ELECTRONIC DEVICE, AND ARTIFICIAL SATELLITE

TECHNICAL FIELD

One embodiment of the present invention relates to a semiconductor device, an electronic device, and an artificial satellite.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, an operation method thereof, a manufacturing method thereof, and a testing method thereof.

In this specification and the like, a semiconductor device generally means a device that can function by utilizing semiconductor characteristics. In some cases, it can be said that a display device (a liquid crystal display device, a light-emitting display device, or the like), a projection device, a lighting device, an electro-optical device, a power storage device, a memory device, a semiconductor circuit, an imaging device, a signal processing device, a transmission/reception device, a wireless sensor, a sensor device, or the like includes a semiconductor device.

BACKGROUND ART

A DC-DC converter is given as an example of a semiconductor device capable of outputting a constant potential. A linear regulator is given as one kind of DC-DC converter. A low drop out regulator (Low Drop Out: LDO) that is a linear regulator that operates even with a small input-output potential difference has been developed (e.g., Patent Document 1).

In addition, a semiconductor device with low power consumption has been desired. In particular, power supply to a device used in space, such as an artificial satellite, is limited in some cases; thus, a semiconductor device provided in a device used in space preferably consumes low power. Patent Document 2 discloses a fault tolerant system with reduced power consumption, and the system is described as being capable of being used in a spacecraft, an artificial satellite, or the like.

REFERENCE

Patent Document

[Patent Document 1] Japanese Published Patent Application No. 2014-36543
[Patent Document 2] Japanese Published Patent Application No. 2012-130239

SUMMARY OF THE INVENTION

Problems to be Solved by the Invention

A linear regulator can include an operational amplifier circuit. In this case, current continuously flows into the operational amplifier circuit during a period in which the linear regulator outputs a potential, which results in an increase in power consumption of the linear regulator.

Thus, an object of one embodiment of the present invention is to provide a semiconductor device with low power consumption. Another object is to provide a semiconductor device that can stably operate. Another object is to provide a highly reliable semiconductor device. Another object is to provide a novel semiconductor device.

Another object is to provide an operation method of a semiconductor device with low power consumption. Another object is to provide an operation method of a semiconductor device that can stably operate. Another object is to provide an operation method of a highly reliable semiconductor device. Another object is to provide an operation method of a novel semiconductor device.

Note that the description of these objects does not preclude the existence of other objects. One embodiment of the present invention does not have to achieve all these objects. Note that objects other than these will be apparent from the description of the specification, the drawings, the claims, and the like, and objects other than these can be derived from the description of the specification, the drawings, the claims, and the like.

Means for Solving the Problems

One embodiment of the present invention is a semiconductor device including an operational amplifier circuit, a first transistor, and a second transistor. An output terminal of the operational amplifier circuit is electrically connected to one of a source and a drain of the first transistor. The other of the source and the drain of the first transistor is electrically connected to a gate of the second transistor.

Alternatively, in the above embodiment, one of a source and a drain of the second transistor may be electrically connected to an input terminal of the operational amplifier circuit.

Alternatively, in the above embodiment, a third transistor and a capacitor may be included. One of a source and a drain of the third transistor may be electrically connected to the other of the source and the drain of the first transistor. The other of the source and the drain of the third transistor may be electrically connected to the gate of the second transistor. One electrode of the capacitor may be electrically connected to the source and the drain of the third transistor.

Alternatively, in the above embodiment, a first signal may be supplied to a gate of the first transistor. A second signal may be supplied to a gate of the third transistor. The first signal and the second signal may be complementary signals.

Another embodiment of the present invention is a semiconductor device including an operational amplifier circuit, a first transistor, a second transistor, a third transistor, a fourth transistor, and a current source. An output terminal of the operational amplifier circuit is electrically connected to one of a source and a drain of the first transistor. The other of the source and the drain of the first transistor is electrically connected to a gate of the second transistor. A first power supply terminal of the operational amplifier circuit is electrically connected to one of a source and a drain of the third transistor. The first power supply terminal of the operational amplifier circuit is electrically connected to one of a source and a drain of the fourth transistor. The other of the source and the drain of the third transistor is electrically connected to the current source. The other of the source and the drain of the fourth transistor is electrically connected to a power supply line.

Alternatively, in the above embodiment, one of a source and a drain of the second transistor may be electrically connected to an input terminal of the operational amplifier circuit.

Alternatively, in the above embodiment, a fifth transistor and a capacitor may be included. One of a source and a drain of the fifth transistor may be electrically connected to the other of the source and the drain of the first transistor. The other of the source and the drain of the fifth transistor may be electrically connected to the gate of the second transistor. One electrode of the capacitor may be electrically connected to the source and the drain of the fifth transistor.

Alternatively, in the above embodiment, a first signal may be supplied to a gate of the first transistor. A second signal may be supplied to a gate of the fifth transistor. A third signal may be supplied to a gate of the third transistor. A fourth signal may be supplied to a gate of the fourth transistor. The first signal and the second signal may be complementary signals, and the third signal and the fourth signal may be complementary signals.

Alternatively, in the above embodiment, the first transistor may include a metal oxide in a channel formation region.

An electronic device including the semiconductor device of one embodiment of the present invention and a housing is also one embodiment of the present invention.

Alternatively, an artificial satellite including the semiconductor device of one embodiment of the present invention and a solar panel is also one embodiment of the present invention.

Effect of the Invention

Thus, according to one embodiment of the present invention, a semiconductor device with low power consumption can be provided. Alternatively, a semiconductor device that can stably operate can be provided. Alternatively, a highly reliable semiconductor device can be provided. Alternatively, a novel semiconductor device can be provided.

Alternatively, an operation method of a semiconductor device with low power consumption can be provided. Alternatively, an operation method of a semiconductor device that can stably operate can be provided. Alternatively, an operation method of a highly reliable semiconductor device can be provided. Alternatively, an operation method of a novel semiconductor device can be provided.

Note that the description of the effects does not preclude the existence of other effects. One embodiment of the present invention does not have to have all these effects. Note that effects other than these will be apparent from the description of the specification, the drawings, the claims, and the like and effects other than these can be derived from the description of the specification, the drawings, the claims, and the like.

MODE FOR CARRYING OUT THE INVENTION

Figure 1A:
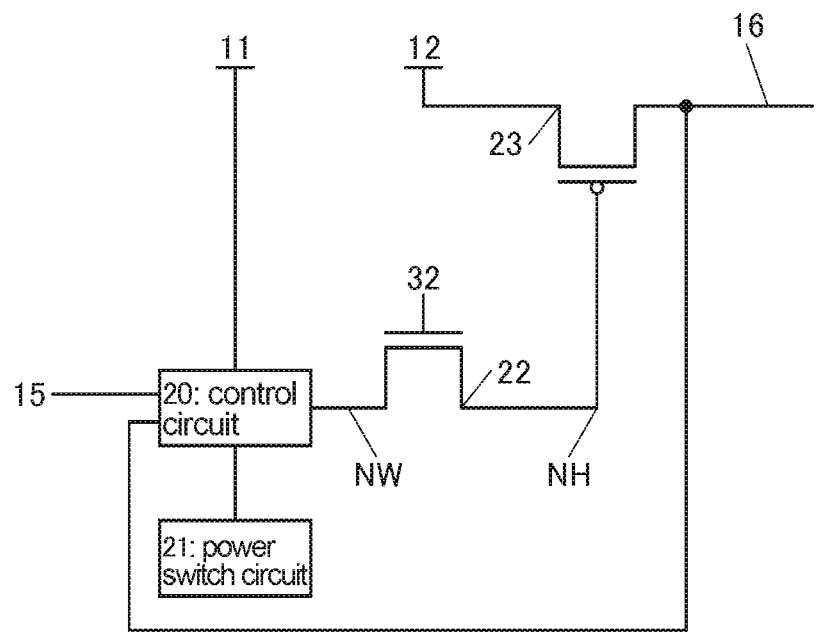
FIG. 1A and FIG. 1B are block diagrams each illustrating a structure example of a semiconductor device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be interpreted as being limited to the descriptions of embodiments below. Note that in structures of the invention described below, the same portions or portions having similar functions are denoted by the same reference numerals in different drawings, and a description thereof is not repeated.

The position, size, range, and the like of each component illustrated in the drawings and the like do not represent the actual position, size, range, and the like in some cases for easy understanding of the invention. Therefore, the disclosed invention is not necessarily limited to the position, size, range, or the like disclosed in the drawings. For example, in an actual manufacturing process, a resist mask or the like might be unintentionally reduced in size by treatment such as etching, which might not be reflected in the drawings for easy understanding.

In a top view (also referred to as a "plan view"), a perspective view, or the like, some components might be omitted for easy understanding of the drawings.

In addition, in this specification and the like, the terms "electrode" and "wiring" do not functionally limit these components. For example, an "electrode" is used as part of a "wiring" in some cases, and vice versa. Moreover, the terms "electrode" and "wiring" also include the case where a plurality of "electrodes" or "wirings" are formed in an integrated manner and the like.

In this specification and the like, the resistance value of a "resistor" is sometimes determined depending on the length of a wiring. Alternatively, the resistance value is sometimes determined by connection of a conductive layer used for a wiring to a conductive layer with resistivity different from that of the conductive layer. Alternatively, the resistance value is sometimes determined by impurity doping in a semiconductor layer.

In this specification and the like, a "terminal" in an electric circuit refers to a portion that inputs or outputs current or voltage or receives or transmits a signal. Accordingly, part of a wiring or an electrode functions as a terminal in some cases.

Note that the term "over" or "under" in this specification and the like does not necessarily mean directly over or directly under regarding the positional relationship between components, nor limit the positional relationship to direct contact. For example, the expression "electrode B over insulating layer A" does not necessarily mean that the electrode B is formed on and in direct contact with the insulating layer A, and does not exclude the case where another component is provided between the insulating layer A and the electrode B.

Furthermore, functions of a source and a drain are interchanged with each other depending on operation conditions, for example, when a transistor of different polarity is employed or when the direction of current flow is changed in circuit operation; therefore, it is difficult to define which is the source or the drain. Therefore, the terms source and drain can be switched in this specification and the like.

In this specification and the like, the expression "electrically connected" includes the case where components are directly connected to each other and the case where components are connected through an "object having any electric function". There is no particular limitation on the "object having any electric function" as long as electric signals can be transmitted and received between components that are connected through the object. Thus, even when the expression "electrically connected" is used, there is a case where no physical connection is made and a wiring just extends in an actual circuit. In addition, the expression "directly connected" includes the case where different conductors are connected to each other through a contact. Note that a wiring may be formed of conductors that contain one or more of the same elements or may be formed of conductors that contain different elements.

In this specification and the like, the terms "identical", "same", "equal", "uniform", and the like used in describing calculation values and actual measurement values allow for a margin of error of ±20% unless otherwise specified.

Furthermore, in this specification and the like, in the case where an etching treatment is performed after a resist mask is formed, the resist mask is removed after the etching treatment, unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification and the like can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification and the like can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification might be provided with an ordinal number in the scope of claims in order to avoid confusion among components. Furthermore, a term with an ordinal number in this specification might be provided with a different ordinal number in the scope of claims. Furthermore, even when a term is provided with an ordinal number in this specification, the ordinal number might be omitted in the scope of claims and the like.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, a metal oxide containing nitrogen is also referred to as a metal oxide in some cases. A metal oxide containing nitrogen may be referred to as a metal oxynitride.

Embodiment 1

In this embodiment, a structure example of a semiconductor device of one embodiment of the present invention and an example of an operation method thereof are described with reference to drawings. Note that the present invention is not limited to the structure examples described in this embodiment. Furthermore, any of the structures can be combined as appropriate.

One embodiment of the present invention is a semiconductor device in which a retention transistor is provided between a control circuit and an output transistor. The control circuit can include an operational amplifier. The semiconductor device of one embodiment of the present invention can be employed for a semiconductor device having a function of continuously outputting a constant potential, such as a DC-DC converter like a linear regulator. In the case where the semiconductor device of one embodiment of the present invention has a function of continuously outputting a constant potential, the constant potential can be output from a source or a drain of the output transistor.

In the semiconductor device of one embodiment of the present invention, for example, an output terminal of the control circuit is electrically connected to one of a source and a drain of the retention transistor, and the other of the source and the drain of the retention transistor is electrically connected to a gate of the output transistor. The control circuit includes a comparison circuit, for example. An output terminal of the comparison circuit can be the output terminal of the control circuit.

In the semiconductor device of one embodiment of the present invention, a node to which the other of the source and the drain of the retention transistor and the gate of the output transistor are electrically connected is a retention node. When the retention transistor is in an on state, a potential corresponding to a potential output from the control circuit is written to the retention node. After that, when the retention transistor is brought into an off state, the potential of the retention node is retained. Thus, even when the control circuit is off, the gate potential of the output transistor can be kept constant. Therefore, even when the control circuit is off, a constant potential can be continuously output from the source or the drain of the output transistor, for example. As described above, since self-consuming current that is current consumed in the control circuit or the like can be reduced, the power consumption of the semiconductor device of one embodiment of the present invention can be reduced.

Here, the retention transistor is preferably a transistor having an extremely low off-state current, such as an OS transistor. Thus, a potential can be continuously retained in the retention node for a long period of time. Accordingly, the frequency of writing of a potential to the retention node can be reduced, so that the power consumption of the semiconductor device of one embodiment of the present invention can be reduced.

<Structure Example of Semiconductor Device>

FIG. 1A is a diagram illustrating a structure example of a semiconductor device 10 that is the semiconductor device of one embodiment of the present invention. The semiconductor device 10 includes a control circuit 20, a power switch circuit 21, a transistor 22, and a transistor 23. The transistor 22 can be provided between the control circuit 20 and the transistor 23.

The control circuit 20 can have a structure including a first power supply terminal, a second power supply terminal, a first input terminal, a second input terminal, and an output terminal, for example. The first power supply terminal of the control circuit 20 can be electrically connected to a wiring 11, for example. The second power supply terminal of the control circuit 20 can be electrically connected to the power switch circuit 21, for example. The first input terminal of the control circuit 20 can be electrically connected to a wiring 15, for example. The second input terminal of the control circuit 20 can be electrically connected to a wiring 16, for example. The output terminal of the control circuit 20 can be electrically connected to one of a source and a drain of the transistor 22, for example. Here, a node to which the output terminal of the control circuit 20 and the one of the source and the drain of the transistor 22 are electrically connected is a node NW.

In this specification and the like, the term "first power supply terminal" and the term "second power supply terminal" can be interchanged with each other as necessary or as appropriate. For example, the wiring 11 may be electrically connected to the second power supply terminal of the control circuit 20, and the power switch circuit 21 may be electrically connected to the first power supply terminal of the control circuit 20. Furthermore, in this specification and the like, the term "first input terminal" and the term "second input terminal" can be interchanged with each other as necessary or as appropriate. For example, the wiring 15 may be electrically connected to the second input terminal of the control circuit 20, and the wiring 16 may be electrically connected to the first input terminal of the control circuit 20.

The wiring 16 is electrically connected to one of a source and a drain of the transistor 23 in addition to the second input terminal of the control circuit 20. The other of the source and the drain of the transistor 22 is electrically connected to a gate of the transistor 23. The other of the source and the drain of the transistor 23 is electrically connected to a wiring 12. Here, a node to which the other of the source and the drain of the transistor 22 and the gate of the transistor 23 are electrically connected is a node NH.

The wiring 11 and the wiring 12 function as power supply lines. The potentials of the wiring 11 and the wiring 12 can be, for example, high potentials.

In this specification and the like, a high potential means a potential higher than a low potential. For example, when a low potential is a ground potential, a high potential can be a positive potential. For example, a high potential can be a potential with which an n-channel transistor is turned on when the potential is supplied to a gate of the transistor with a source potential set to a low potential, and a low potential can be a potential with which the transistor is turned off. For another example, a high potential can be a potential with which a p-channel transistor is turned off when the potential is supplied to a gate of the transistor with a source potential set to a high potential, and a low potential can be a potential with which the transistor is turned on.

The wiring 16 functions as an output line outputting a desired potential to the outside of the semiconductor device 10. The wiring 16 can be electrically connected to a device provided outside the semiconductor device 10, for example.

The control circuit 20 has a function of outputting, from the output terminal, a potential corresponding to a potential supplied to the input terminal. Here, as described above, the wiring 16 electrically connected to the second input terminal functions as an output line. Thus, it can be said that the control circuit 20 is feedback-controlled. In this manner, the control circuit 20 can output a potential corresponding to the potential of the wiring 15 electrically connected to the first input terminal. Here, the potential of the wiring 15 can be called a reference potential, for example.

The power switch circuit 21 can control on and off of the control circuit 20 by controlling current or a potential supplied to the control circuit 20. Here, "the control circuit 20 is on" means that the control circuit 20 is in a state of being capable of outputting a desired potential, and "the control circuit 20 is off" means that the control circuit 20 is not in a state of being capable of outputting a desired potential. For example, in the case where the control circuit 20 is on, the control circuit 20 outputs a potential corresponding to the potential of the wiring 15, and in the case where the control circuit 20 is off, a potential output by the control circuit 20 is a potential not corresponding to the potential of the wiring 15.

The transistor 22 has a function of controlling writing of a potential to the node NH. Specifically, in the case where the transistor 22 is in an on state, the potential output from the control circuit 20 is written to the node NH, and in the case where the transistor 22 is in an off state, the potential of the node NH is retained. That is, the transistor 22 can be called a retention transistor.

It is preferable to use a transistor having an extremely low off-state current as the transistor 22. Thus, a period in which a potential can be retained in the node NH can be extremely long. An OS transistor is given as an example of a transistor having an extremely low off-state current. Specifically, the off-state current per micrometer of channel width at room temperature can be lower than $1\times10^{-20}$ A, preferably lower than $1\times10^{-22}$ A, further preferably lower than $1\times10^{-24}$ A.

In addition, the OS transistor has superior electrical characteristics in a high-temperature environment to a transistor including silicon in its semiconductor layer (hereinafter also referred to as a Si transistor). Accordingly, when an OS transistor is used as a transistor included in the semiconductor device of one embodiment of the present invention, such as the transistor 22, the semiconductor device achieves stable operation even in a high-temperature environment and high reliability.

The transistor 23 has a function of outputting a potential corresponding to the potential of the node NH to the wiring 16. That is, the transistor 23 can be called an output transistor. The transistor 23 can be a p-channel transistor, for example. The transistor 23 can be a Si transistor, for example. A Si transistor can be used as a transistor included in the semiconductor device 10 besides the transistor 23.

As described above, the potential output from the control circuit 20 can be a potential corresponding to the potential of the wiring 15, and the potential output from the control circuit 20 is written to the node NH to be retained. Then, the potential of the wiring 16 becomes a potential corresponding to the potential of the node NH. Thus, the potential of the wiring 16 can be a potential corresponding to the potential of the wiring 15. For example, the potential of the wiring 16 can be the same or substantially the same as the potential of the wiring 15.

In the semiconductor device 10, when the control circuit 20 is in an on state and the transistor 22 is in an on state, the potential output from the control circuit 20 is written to the node NH. After that, the transistor 22 is brought into an off state and the potential of the node NH is retained, whereby the semiconductor device 10 can continuously output a desired potential from the wiring 16 even when the control circuit 20 is in an off state. As described above, since self-consuming current that is current consumed in the control circuit 20 or the like can be reduced, the power consumption of the semiconductor device 10 can be reduced.

The semiconductor device 10 can be employed for a semiconductor device having a function of continuously outputting a constant potential, for example. For example, the semiconductor device 10 can be employed for a DC-DC converter or a linear regulator.

Figure 1B:
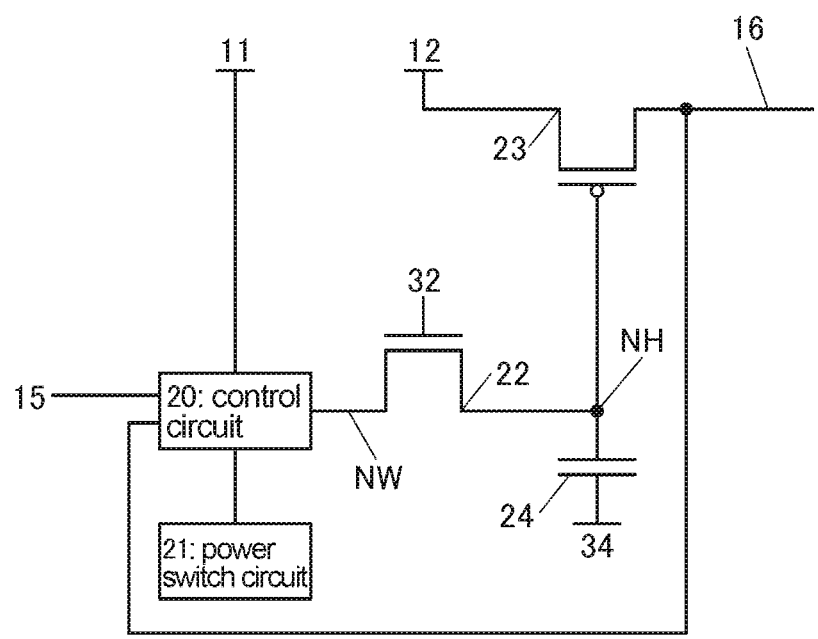

FIG. 1B illustrates a modification example of the semiconductor device 10 having the structure illustrated in FIG. 1A, which is different from the semiconductor device 10 having the structure illustrated in FIG. 1A in that a capacitor 24 is included. The capacitance value of the capacitor 24 can be, for example, greater than or equal to 100 aF and less than or equal to 100 pF, greater than or equal to 10 fF and less than or equal to 50 pF, greater than or equal to 100 fF and less than or equal to 10 pF, or greater than or equal to 1 pF and less than or equal to 5 pF.

One electrode of the capacitor 24 is electrically connected to the node NH. The other electrode of the capacitor 24 is electrically connected to a wiring 34. The wiring 34 functions as a power supply line. The potential of the wiring 34 can be, for example, a low potential such as a ground potential.

When the semiconductor device 10 has the structure illustrated in FIG. 1B, a larger amount of charge can be retained in the node NH. Thus, the potential of the node NH can be retained for a long period of time.

Figure 2A:
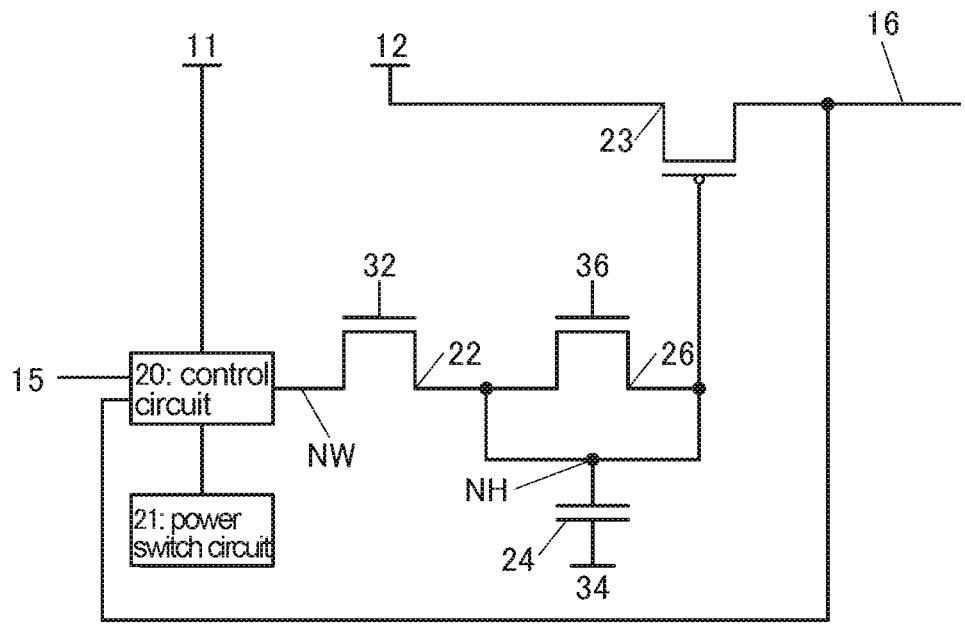
FIG. 2A and FIG. 2B are block diagrams each illustrating a structure example of a semiconductor device.

FIG. 2A illustrates a modification example of the semiconductor device 10 having the structure illustrated in FIG. 1B, which is different from the semiconductor device 10 having the structure illustrated in FIG. 1B in that a transistor 26 is included. As illustrated in FIG. 2A, the transistor 22, the capacitor 24, and the transistor 26 can be provided between the control circuit 20 and the transistor 23. A source and a drain of the transistor 26 are electrically connected to the node NH. A gate of the transistor 26 is electrically connected to a wiring 36.

In the semiconductor device 10 having the structure illustrated in FIG. 2A, for example, the transistor 26 is in an off state when the transistor 22 is in an on state, and the transistor 26 is in an on state when the transistor 22 is in an off state. Thus, a change in the potential of the node NH due to capacitive coupling of the capacitor 24 or the like in the case where the transistor 22 is in an off state can be inhibited. Accordingly, a change in the potential of the wiring 16 can be inhibited, and the semiconductor device 10 can stably operate. In particular, in the case where the semiconductor device 10 is employed for a DC-DC converter, a liner regulator, or the like, a high accuracy of the output potential of the semiconductor device 10 is required; thus, the potential of the node NH is preferably changed as little as possible. Therefore, particularly in the case where the semiconductor device 10 is employed for a DC-DC converter, a linear regulator, or the like, the transistor 26 is preferably provided in the semiconductor device 10.

Figure 2B:
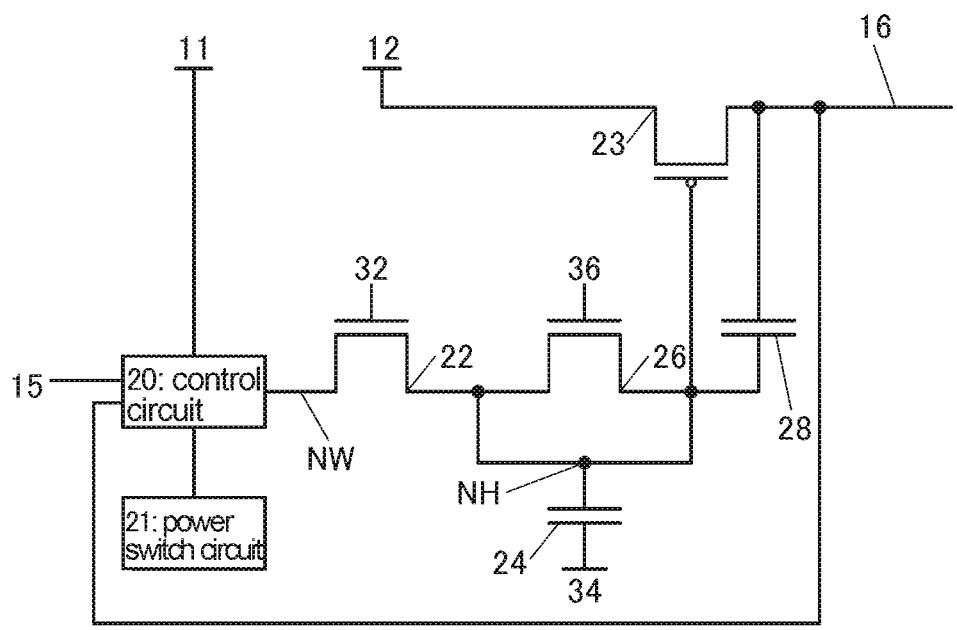

FIG. 2B illustrates a modification example of the semiconductor device 10 having the structure illustrated in FIG. 2A, which is different from the semiconductor device 10 having the structure illustrated in FIG. 2A in that a capacitor 28 is included. The capacitance value of the capacitor 28 can be greater than or equal to the capacitance value of the capacitor 24, for example.

One electrode of the capacitor 28 is electrically connected to the node NH, and the other electrode of the capacitor 28 is electrically connected to the wiring 16.

In the case where the semiconductor device 10 does not include the capacitor 28 and the transistor 23 is a p-channel transistor, the potential of the wiring 16 becomes lower as the potential of the node NH becomes higher, and the potential of the wiring 16 becomes higher as the potential of the node NH becomes lower. When the capacitor 28 is provided in the semiconductor device 10, the potential of the other electrode of the capacitor 28 becomes higher as the potential of the one electrode of the capacitor 28 becomes higher, and the potential of the other electrode of the capacitor 28 becomes lower as the potential of the one electrode of the capacitor 28 becomes lower. Accordingly, a change in the potential of the wiring 16 due to a change in the potential of the node NH can be canceled. Thus, a change in the potential of the wiring 16 due to a change in the potential of the node NH can be inhibited, and the semiconductor device 10 can stably operate. Note that a larger capacitance value of the capacitor 28 enhances the effect of inhibiting a change in the potential of the wiring 16 due to a change in the potential of the node NH, enabling stable operation of the semiconductor device 10.

The capacitor 28 can have a function similar to that of the capacitor 24. That is, the capacitor 28 has a function of retaining the potential of the node NH, for example. Thus, in the case where the semiconductor device 10 includes the capacitor 28, the semiconductor device 10 can have a structure without the capacitor 24. Alternatively, the capacitance value of the capacitor 24 can be reduced.

Figure 3A:
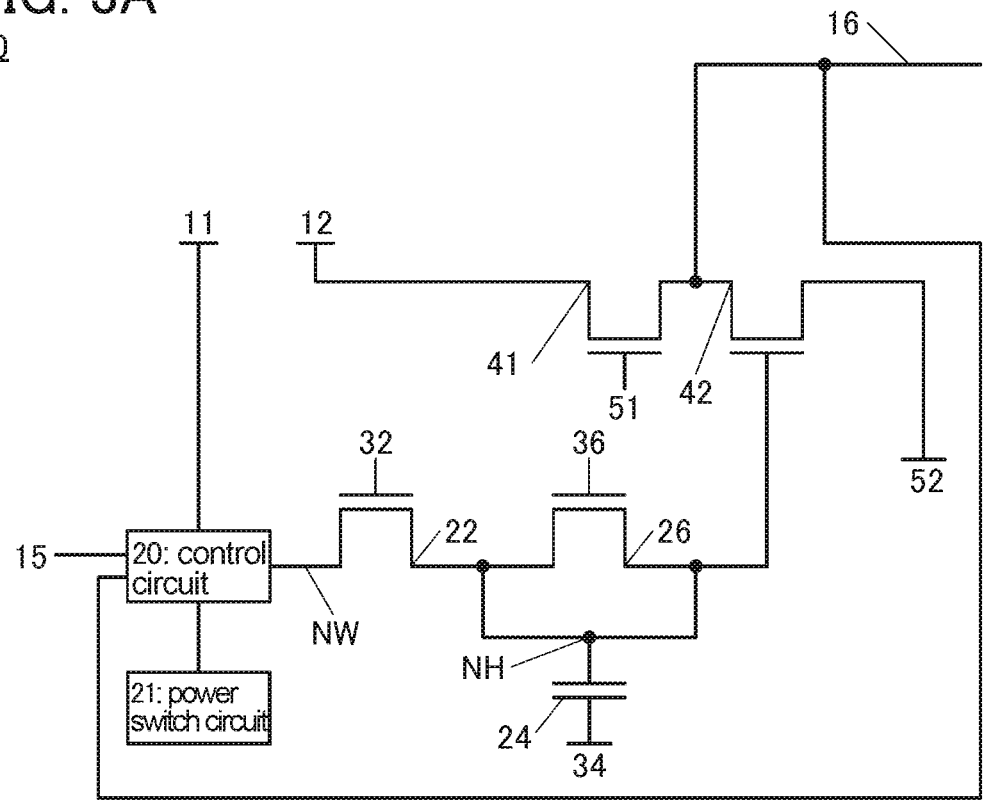
FIG. 3A and FIG. 3B are block diagrams each illustrating a structure example of a semiconductor device.

FIG. 3A illustrates a modification example of the semiconductor device 10 having the structure illustrated in FIG. 2A, which is different from the semiconductor device 10 having the structure illustrated in FIG. 2A in that the transistor 23 is not included and a transistor 41 and a transistor 42 are included. As illustrated in FIG. 3A, the transistor 22, the capacitor 24, and the transistor 26 can be provided between the control circuit 20 and the transistor 42.

One of a source and a drain of the transistor 41 is electrically connected to the wiring 12. The other of the source and the drain of the transistor 41 and one of a source and a drain of the transistor 42 are electrically connected to the wiring 16. The other of the source and the drain of the transistor 42 is electrically connected to a wiring 52. A gate of the transistor 41 is electrically connected to a wiring 51. A gate of the transistor 42 is electrically connected to the node NH.

A bias potential can be supplied to the wiring 51. The bias potential can be, for example, a constant potential. With the bias potential supplied to the wiring 51, the transistor 41 can function as a current source. The wiring 52 functions as a power supply line. For example, the potential of the wiring 52 can be a low potential such as a ground potential.

The transistor 41 and the transistor 42 can be n-channel transistors, for example. When the potential of the wiring 12 is a high potential, the potential of the wiring 52 is a low potential, and the transistor 41 and the transistor 42 are n-channel transistors, the potential of the wiring 16 becomes lower as the potential of the node NH becomes higher, and the potential of the wiring 16 becomes higher as the potential of the node NH becomes lower. That is, even when a p-channel transistor is not used as an output transistor, the semiconductor device 10 can operate in a manner similar to, for example, that in the case where a p-channel transistor is used as an output transistor.

In the case where the transistor 41 and the transistor 42 are n-channel transistors, OS transistors can be used as the transistor 41 and the transistor 42. As described above, an OS transistor has superior electrical characteristics in a high-temperature environment to a Si transistor. Accordingly, when OS transistors are used as the transistor 41 and the transistor 42, the potential of the wiring 16 is stabilized even in a high-temperature environment. Thus, the potential output from the semiconductor device 10 can be stabilized even in a high-temperature environment and the semiconductor device 10 can stably operate.

Figure 3B:
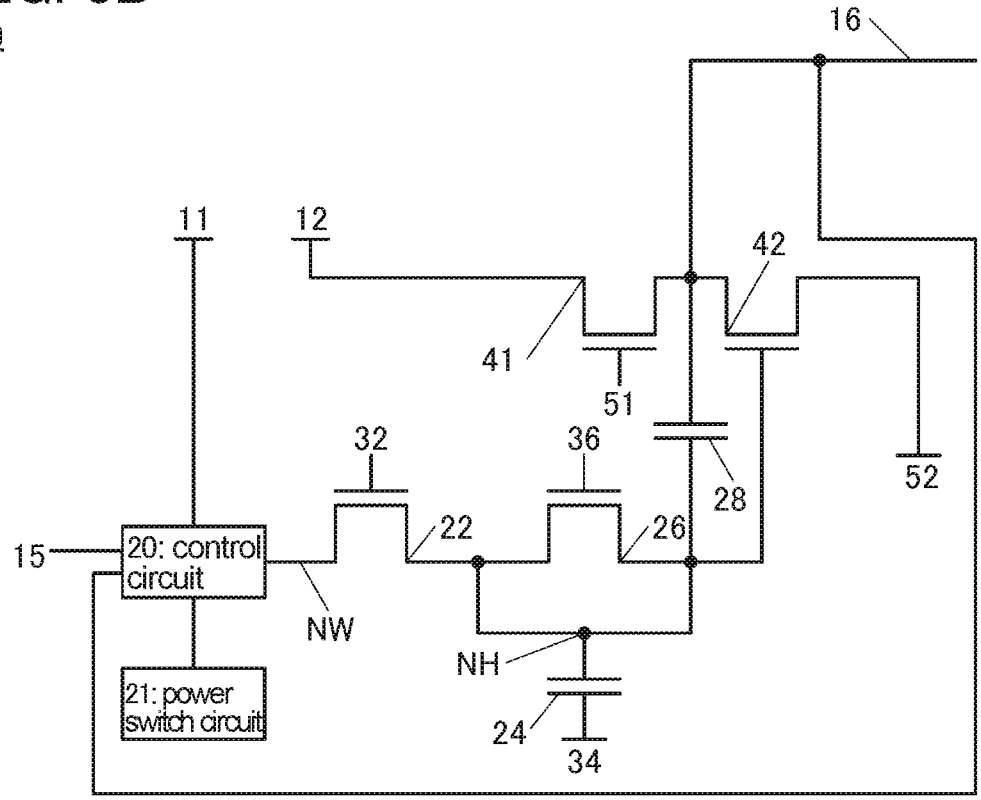

FIG. 3B illustrates a modification example of the semiconductor device 10 having the structure illustrated in FIG. 3A, which is different from the semiconductor device 10 having the structure illustrated in FIG. 3A in that the capacitor 28 is included. As in the semiconductor device 10 having the structure illustrated in FIG. 2B, the one electrode of the capacitor 28 is electrically connected to the node NH, and the other electrode of the capacitor 28 is electrically connected to the wiring 16.

When the semiconductor device 10 has the structure illustrated in FIG. 3B, the semiconductor device 10 can stably operate as in the case where the semiconductor device 10 has the structure illustrated in FIG. 2B.

Figure 4:
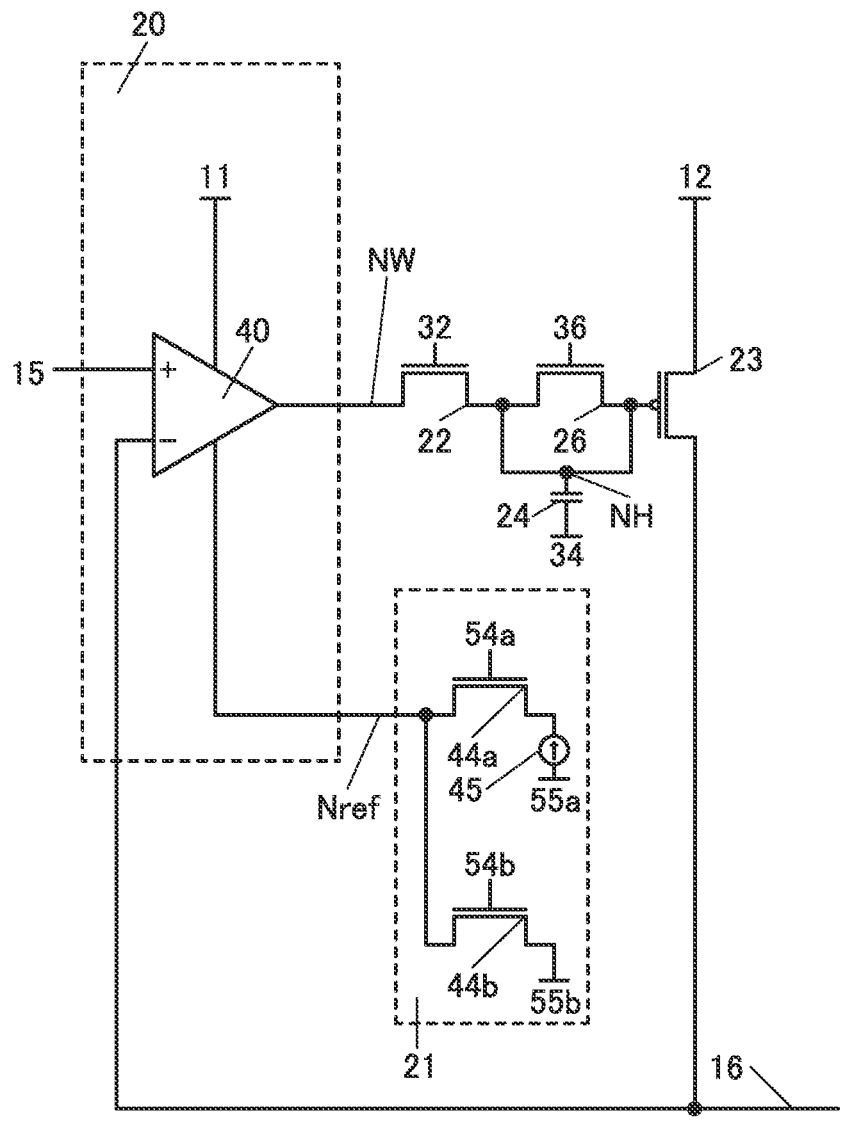
FIG. 4 is a circuit diagram illustrating a structure example of a semiconductor device.

FIG. 4 is a circuit diagram illustrating a more specific structure example of the semiconductor device 10 illustrated in FIG. 2A. FIG. 4 illustrates a circuit structure example of the control circuit 20 and the power switch circuit 21.

The control circuit 20 includes an operational amplifier circuit 40. The power switch circuit 21 includes a transistor 44a, a transistor 44b, and a current source 45.

The operational amplifier circuit 40 can have a structure including a first power supply terminal, a second power supply terminal, a first input terminal, a second input terminal, and an output terminal, for example. In this case, the first and second power supply terminals, the first and second input terminals, and the output terminal of the operational amplifier circuit 40 can also serve as the first and second power supply terminals, the first and second input terminals, and the output terminal of the control circuit 20, respectively.

The first power supply terminal of the operational amplifier circuit 40 is electrically connected to the wiring 11. The second power supply terminal of the operational amplifier circuit 40 is electrically connected to one of a source and a drain of the transistor 44a and one of a source and a drain of the transistor 44b. Here, a node to which the second power supply terminal of the operational amplifier circuit 40, the one of the source and the drain of the transistor 44a, and the one of the source and the drain of the transistor 44b are electrically connected is a node Nref.

The first input terminal of the operational amplifier circuit 40 is electrically connected to the wiring 15. The second input terminal of the operational amplifier circuit 40 is electrically connected to the wiring 16. FIG. 4 illustrates the case where a non-inverting input terminal serves as the first input terminal of the operational amplifier circuit 40 and an inverting input terminal serves as the second input terminal of the operational circuit 40. The output terminal of the operational amplifier circuit 40 is electrically connected to the node NW.

The other of the source and the drain of the transistor 44a is electrically connected to one electrode of the current source 45. A gate of the transistor 44a is electrically connected to a wiring 54a. The other electrode of the current source 45 is electrically connected to a wiring 55a. The other of the source and the drain of the transistor 44b is electrically connected to a wiring 55b. A gate of the transistor 44b is electrically connected to a wiring 54b.

The wiring 55a and the wiring 55b function as power supply lines. For example, the potentials of the wiring 55a and the wiring 55b can be low potentials such as ground potentials.

In the semiconductor device 10 having the structure illustrated in FIG. 4, when the transistor 44a is in an on state and the transistor 44b is in an off state, the operational amplifier circuit 40 is on. Accordingly, the operational amplifier circuit 40 can output a potential corresponding to the potential of the wiring 15, for example. In contrast, when the transistor 44a is in an off state and the transistor 44b is in an on state, the operational amplifier circuit 40 is off. Accordingly, the operational amplifier circuit 40 can stop outputting a potential, for example. Details of switching on and off of the operational amplifier circuit 40 will be described later.

Figure 5:
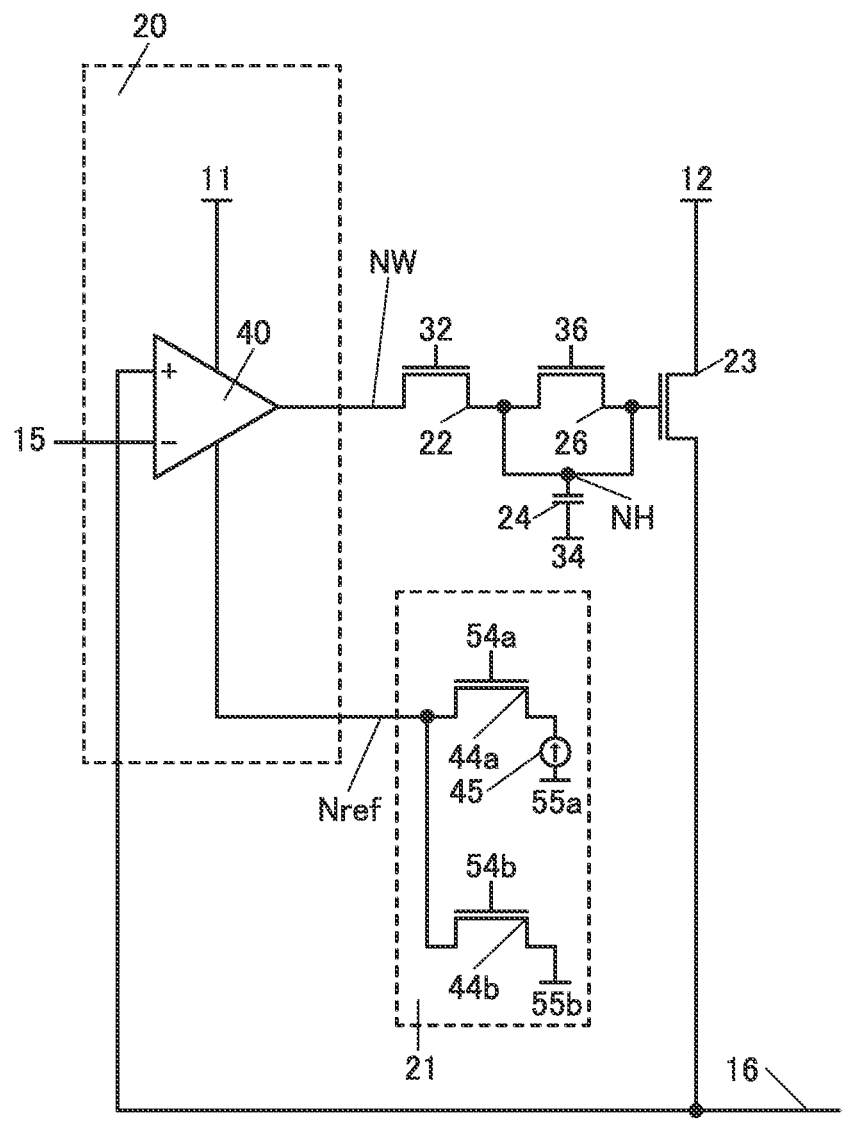
FIG. 5 is a circuit diagram illustrating a structure example of a semiconductor device.

FIG. 5 illustrates a modification example of the semiconductor device 10 having the structure illustrated in FIG. 4, which is different from the semiconductor device 10 having the structure illustrated in FIG. 4 in that the transistor 23 is an n-channel transistor. In the semiconductor device 10 having the structure illustrated in FIG. 5, the wiring 15 can be electrically connected to the inverting input terminal of the operational amplifier circuit 40 and the wiring 16 can be electrically connected to the non-inverting input terminal of the operational amplifier circuit 40.

When the transistor 23 is an n-channel transistor, the transistor 23 can be an OS transistor. As described above, an OS transistor has superior electrical characteristics in a high-temperature environment to a Si transistor. Accordingly, when an OS transistor is used as the transistor 23, the potential of the wiring 16 is stabilized even in a high-temperature environment. Thus, the potential output from the semiconductor device 10 can be stabilized even in a high-temperature environment and the semiconductor device 10 can stably operate.

Figure 6:
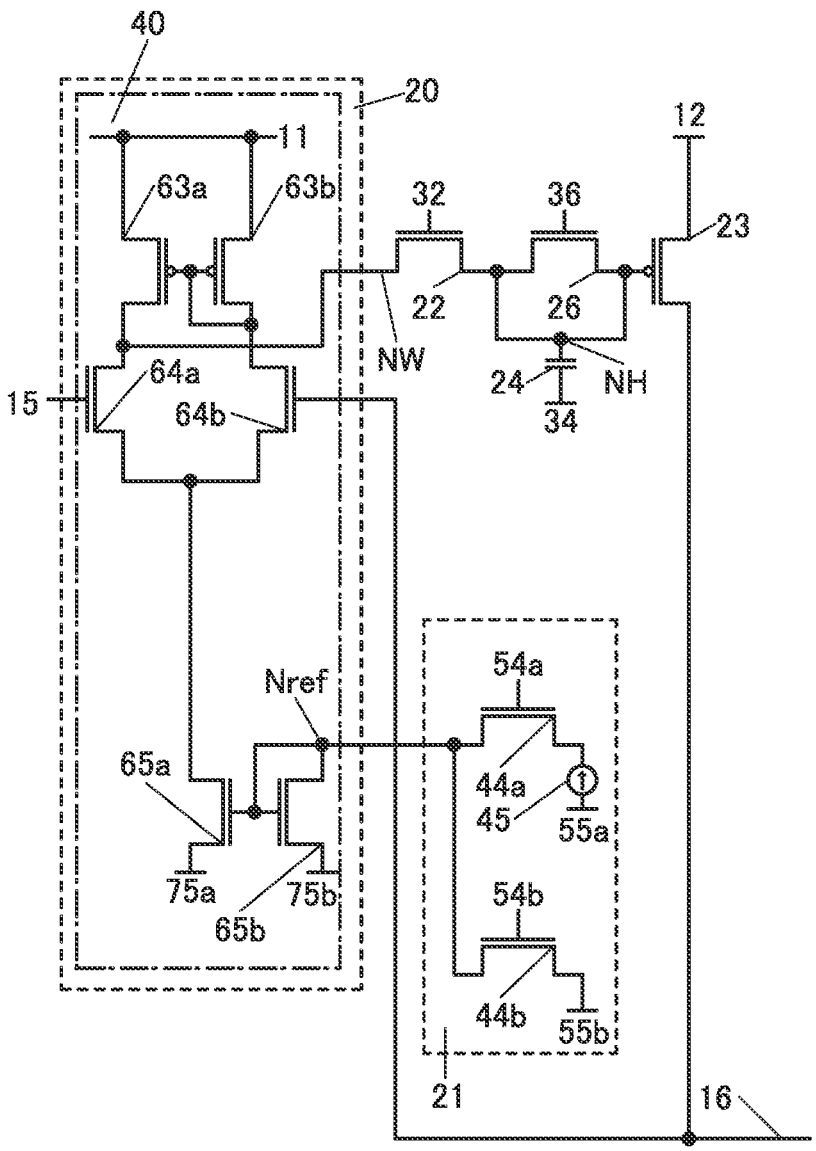
FIG. 6 is a circuit diagram illustrating a structure example of a semiconductor device.

FIG. 6 is a circuit diagram illustrating a specific structure example of the semiconductor device 10 illustrated in FIG. 4, and illustrates a circuit structure example of the operational amplifier circuit 40.

The operational amplifier circuit 40 includes a transistor 63a, a transistor 63b, a transistor 64a, a transistor 64b, a transistor 65a, and a transistor 65b.

One of a source and a drain of the transistor 63a and one of a source and a drain of the transistor 63b are electrically connected to the wiring 11. The other of the source and the drain of the transistor 63a is electrically connected to one of a source and a drain of the transistor 64a. The one of the source and the drain of the transistor 64a is electrically connected to the one of the source and the drain of the transistor 22. A gate of the transistor 63a is electrically connected to a gate of the transistor 63b. The gate of the transistor 63b is electrically connected to the other of the source and the drain of the transistor 63b. The other of the source and the drain of the transistor 63b is electrically connected to one of a source and a drain of the transistor 64b. The other of the source and the drain of the transistor 64a and the other of the source and the drain of the transistor 64b are electrically connected to one of a source and a drain of the transistor 65a. The other of the source and the drain of the transistor 65a is electrically connected to a wiring 75a. A gate of the transistor 65a, a gate of the transistor 65b, and one of a source and a drain of the transistor 65b are electrically connected to the node Nref. The other of the source and the drain of the transistor 65b is electrically connected to a wiring 75b.

A gate of the transistor 64a is electrically connected to the wiring 15, and a gate of the transistor 64b is electrically connected to the wiring 16. That is, it can be said that the gate of the transistor 64a is the first input terminal of the operational amplifier circuit 40 and the gate of the transistor 64b is the second input terminal of the operational amplifier circuit 40.

The wiring 75a and the wiring 75b function as power supply lines. For example, the potentials of the wiring 75a and the wiring 75b can be low potentials such as ground potentials.

Figure 7:
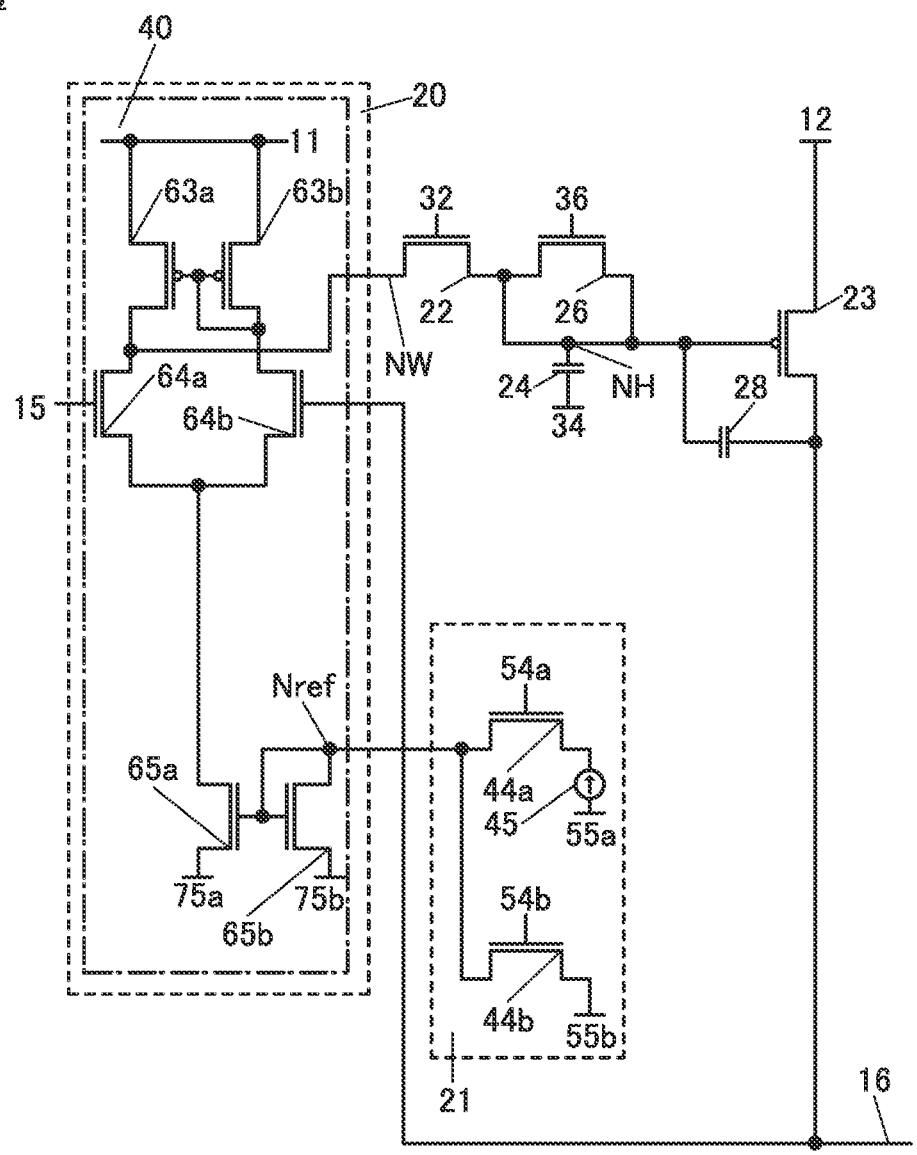
FIG. 7 is a circuit diagram illustrating a structure example of a semiconductor device.

FIG. 7 illustrates a modification example of the semiconductor device 10 having the structure illustrated in FIG. 6, which is different from the semiconductor device 10 having the structure illustrated in FIG. 6 in that the capacitor 28 is included. As in the case illustrated in FIG. 2B, the one electrode of the capacitor 28 is electrically connected to the node NH and the other electrode of the capacitor 28 is electrically connected to the wiring 16.

When the semiconductor device 10 includes the capacitor 28, the semiconductor device 10 can stably operate as described above.

<Example of Operation Method of Semiconductor Device>

Figure 8:
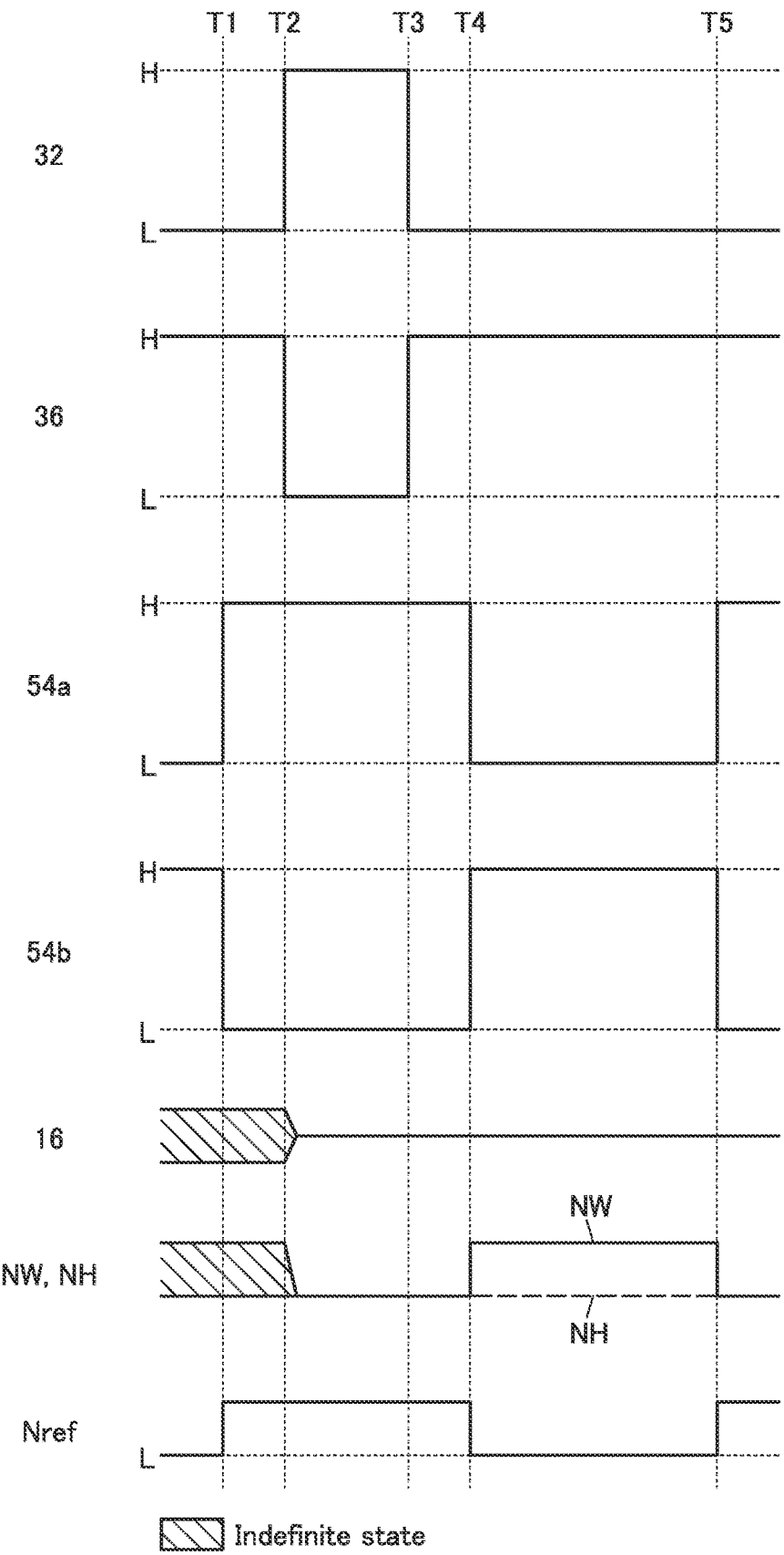
FIG. 8 is a timing chart illustrating an example of an operation method of a semiconductor device.

Next, an example of an operation method of the semiconductor device 10 is described. FIG. 8 is a timing chart showing an example of an operation method of the semiconductor device 10 having the structure illustrated in FIG. 6 or the like. In FIG. 8, "H" indicates a high potential and "L" indicates a low potential. Note that the potentials of the wiring 11 and the wiring 12 are high potentials in the following description. In addition, the potentials of the wiring 34, the wiring 55a, the wiring 55b, the wiring 75a, and the wiring 75b are low potentials.

Before Time T1, the potential of the wiring 32 is a low potential, the potential of the wiring 36 is a high potential, the potential of the wiring 54a is a low potential, and the potential of the wiring 54b is a high potential. Accordingly, the transistor 22 is in an off state, the transistor 26 is in an on state, the transistor 44a is in an off state, and the transistor 44b is in an on state. Since the potential of the node Nref is a low potential in this state, current does not flow into the transistor 65b and current does not flow into the transistor 65a either. Accordingly, it can be said that the operational amplifier circuit 40 is off.

From Time T1 to Time T2, the potential of the wiring 32 is a low potential, the potential of the wiring 36 is a high potential, the potential of the wiring 54a is a high potential, and the potential of the wiring 54b is a low potential. Accordingly, the transistor 22 is in an off state, the transistor 26 is in an on state, the transistor 44a is in an on state, and the transistor 44b is in an off state. The transistor 44a is brought into an on state, so that current flows from the current source 45 toward the node Nref, increasing the potential of the node Nref. In this manner, current flows between the source and the drain of the transistor 65b. Here, the transistor 65a and the transistor 65b form a current mirror, so that current also flows into the transistor 65a. Accordingly, current flows between the wiring 11 and the wiring 75a and the wiring 75b, and the operational amplifier circuit 40 is on.

Thus, it can be said that the operational amplifier circuit 40 is off when the potential of the node Nref is a low potential, and that the operational amplifier circuit 40 is on when the potential of the node Nref is a potential higher than the low potential.

From Time T2 to Time T3, the potential of the wiring 32 is a high potential, the potential of the wiring 36 is a low potential, the potential of the wiring 54a is a high potential, and the potential of the wiring 54b is a low potential. Accordingly, the transistor 22 is in an on state, the transistor 26 is in an off state, the transistor 44a is in an on state, and the transistor 44b is in an off state. The transistor 22 is brought into an on state, so that a potential output from the control circuit 20 is written to the node NH. Thus, the potential of the wiring 16 becomes a potential corresponding to the potential of the node NH that is the gate potential of the transistor 23. As described above, the potential of the node NH can be a potential corresponding to the potential of the wiring 15. Thus, the potential of the wiring 16 becomes a potential corresponding to the potential of the wiring 15 from Time T2 to Time T3. Note that from Time T2 to Time T3 in FIG. 8, the potential of the node NH is equal to the potential of the node NW that is a node to which the output terminal of the control circuit 20 is electrically connected.

From Time T3 to Time T4, the potential of the wiring 32 is a low potential, the potential of the wiring 36 is a high potential, the potential of the wiring 54a is a high potential, and the potential of the wiring 54b is a low potential. Accordingly, the transistor 22 is in an off state, the transistor 26 is in an on state, the transistor 44a is in an on state, and the transistor 44b is in an off state. The transistor 22 is brought into an off state and the transistor 26 is brought into an on state, so that the potential of the node NH is retained.

From Time T4 to Time T5, the potential of the wiring 32 is a low potential, the potential of the wiring 36 is a high potential, the potential of the wiring 54a is a low potential, and the potential of the wiring 54b is a high potential. Accordingly, the transistor 22 is in an off state, the transistor 26 is in an on state, the transistor 44a is in an off state, and the transistor 44b is in an on state. The transistor 44a is brought into an off state and the transistor 44b is brought into an on state, so that the potential of the node Nref becomes a low potential, and current stops flowing between the source and the drain of the transistor 65b. In addition, current stops flowing between the source and the drain of the transistor 65a, so that the potential of the one of the source and the drain of the transistor 65a becomes closer to the potential of the wiring 11, i.e., a high potential. Here, the potential of the wiring 75a is a low potential, which is lower than the potential of the wiring 11, so that the potential of the one of the source and the drain of the transistor 65a is increased. Thus, the potential of the node NW is increased. Accordingly, the operational amplifier circuit 40 is off.

Here, since the transistor 22 is in an off state, the potential of the node NH is not changed even when the potential of the node NW is changed. Thus, even from Time T4 to Time T5 when the operational amplifier circuit 40 is off, the potential of the wiring 16 is not changed from the potential from Time T2 to Time T4 when the operational amplifier circuit 40 is on.

From Time T4 to Time T5, the potential of the node NW is increased while the potential of the node NH is not changed; thus, when the transistor 22 is an n-channel transistor, the source of the transistor 22 is electrically connected to the node NH. Accordingly, as a potential written to the node NH is increased from Time T2 to Time T3, a difference between the gate potential of the transistor 22 and the source potential of the transistor 22 becomes small (an absolute value of the difference becomes large in the case where the difference is a negative value) when the transistor 22 is brought into an off state. Thus, the off-state current of the transistor 22 becomes low, whereby the potential of the node NH can be retained for a long period of time. For example, when a low potential is a ground potential and a potential written to the node NH is a positive potential, the difference between the gate potential of the transistor 22 and the source potential of the transistor 22 is negative. Accordingly, in the case where the gate potential of the transistor 22 is equal to the source potential of the transistor 22, for example, the off-state current of the transistor 22 becomes lower than that in the case where the gate potential of the transistor 22 and the source potential of the transistor 22 are both ground potentials, and the potential of the node NH can be retained for a long period of time.

After Time T5, operation from Time T1 to Time T5 is repeated. Thus, the operational amplifier circuit 40 can be turned off after a potential is written to the node NH again with the operational amplifier circuit 40 turned on. The above is an example of the operation method of the semiconductor device 10.

Note that as illustrated in FIG. 8, the potential of the wiring 36 is a high potential during a period in which the potential of the wiring 32 is a low potential, and the potential of the wiring 36 is a low potential during a period in which the potential of the wiring 32 is a high potential. That is, it can be said that complementary signals are supplied to the wiring 32 and the wiring 36. Moreover, the potential of the wiring 54b is a high potential during a period in which the potential of the wiring 54a is a low potential, and the potential of the wiring 54b is a low potential during a period in which the potential of the wiring 54a is a high potential. That is, it can be said that complementary signals are supplied to the wiring 54a and the wiring 54b. Note that the potentials of both the wiring 32 and the wiring 36 may be low potentials during a period, and the potentials of both the wiring 32 and the wiring 36 may be high potentials during another period. Furthermore, the potentials of both the wiring 54a and the wiring 54b may be low potentials during a period, and the potentials of both the wiring 54a and the wiring 54b may be high potentials during another period. For example, within 20% of a period from Time T1 to Time T5, the potentials of both the wiring 32 and the wiring 36 may be high potentials or low potentials. Alternatively, within 20% of the period from Time T1 to Time T5, the potentials of both the wiring 54a and the wiring 54b may be high potentials or low potentials.

By the operation method shown in FIG. 8, with the potential of the node NH retained, the semiconductor device 10 can continuously output a desired potential even when the operational amplifier circuit 40 is turned off. As described above, in the case where the operational amplifier circuit 40 is turned off, current does not flow into the transistor 65a and the transistor 65b. Accordingly, self-consuming power can be reduced when the semiconductor device 10 operates by the method shown in FIG. 8, and thus the power consumption of the semiconductor device 10 can be reduced.

As described above, the transistor 22 is preferably a transistor having an extremely low off-state current, such as an OS transistor. Thus, a potential can be retained in the node NH for a long period of time, extending the period from Time T4 to Time T5. Accordingly, the frequency of potential writing to the node NH can be reduced. That is, the frequency of performing the operation from Time T1 to Time T4 can be reduced. Thus, the power consumption of the semiconductor device 10 can be reduced.

As described above, the semiconductor device 10 can be employed for a DC-DC converter, a linear regulator, or the like. They require high accuracy of an output potential. As described above, the transistor 22 can be a transistor having an extremely low off-state current, such as an OS transistor. In the case where the semiconductor device 10 operates by the method shown in FIG. 8, a difference between the gate potential of the transistor 22 and the source potential of the transistor becomes small (an absolute value of the difference becomes large in the case where the difference is a negative value) when the transistor 22 is brought into an off state. Thus, the potential of the node NH can be retained with high accuracy in the semiconductor device 10 even when the operational amplifier circuit 40 is off. Accordingly, the semiconductor device 10 can continuously output a highly accurate potential, and the semiconductor device 10 can stably operate.

This embodiment can be implemented in an appropriate combination with the structures described in the other embodiments and the like.

Embodiment 2

In this embodiment, a cross-sectional structure example of the semiconductor device described in the above embodiment will be described with reference to drawings.

Figure 9:
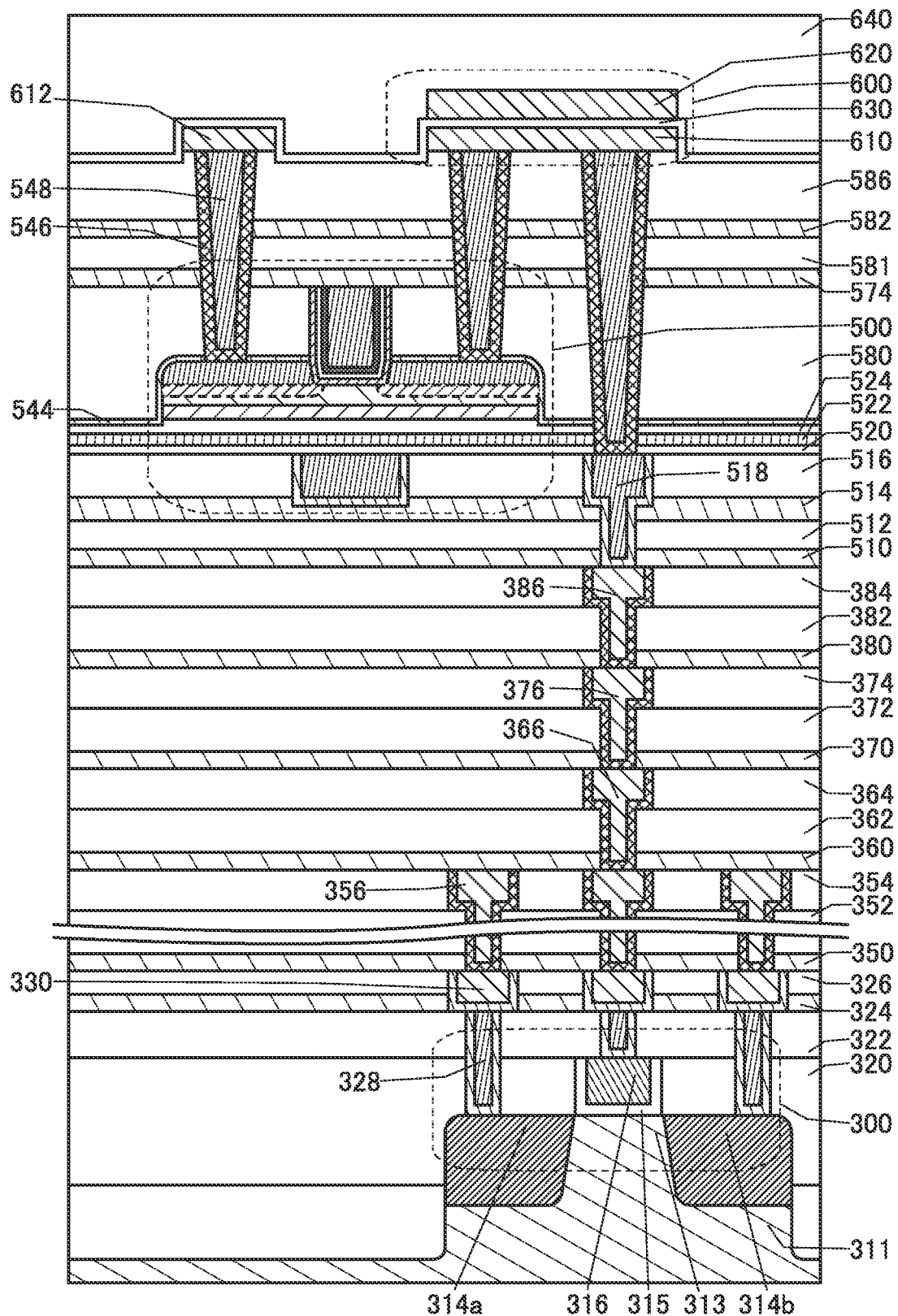
FIG. 9 is a schematic cross-sectional view illustrating a structure example of a semiconductor device.
Figure 11A:
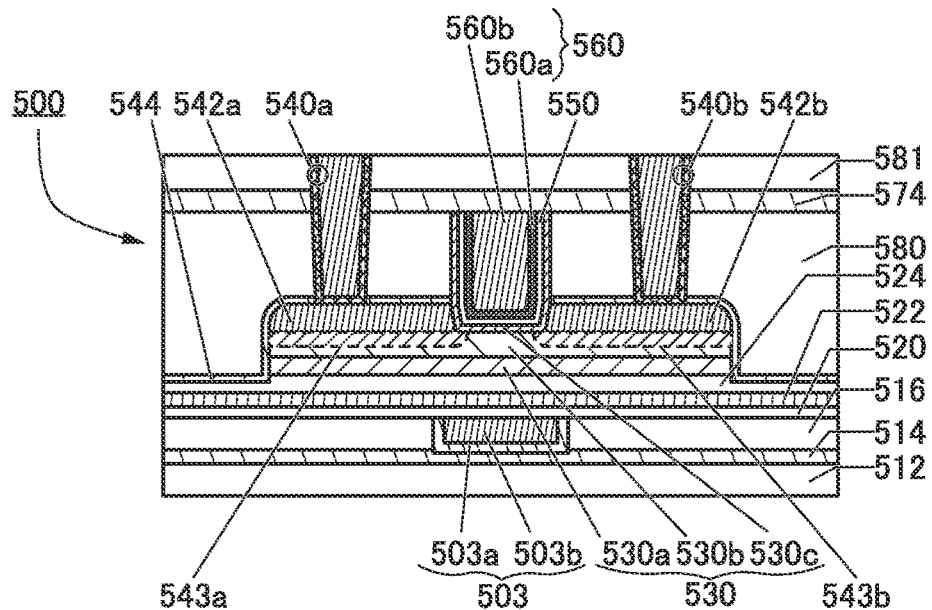
FIG. 11A to FIG. 11C are schematic cross-sectional views illustrating structure examples of transistors.
Figure 11B:
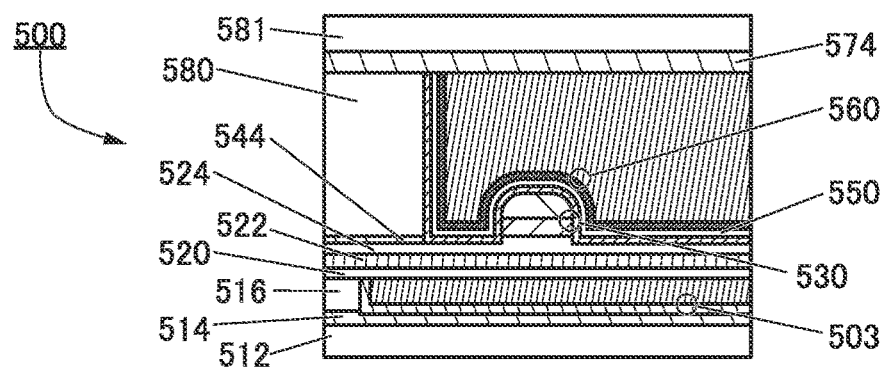
Figure 11C:
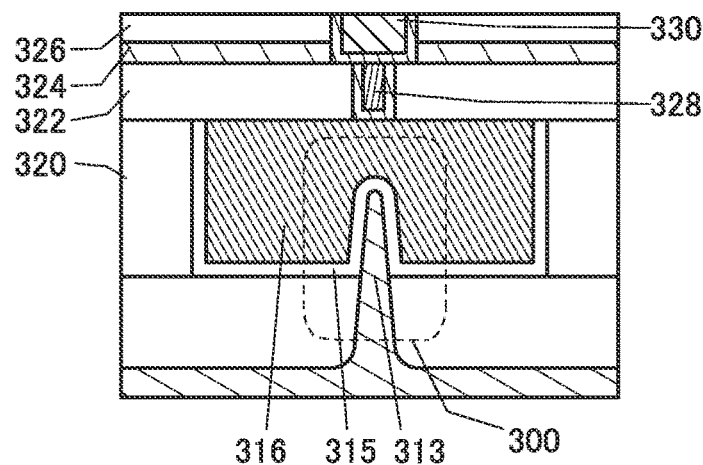

A semiconductor device illustrated in FIG. 9 includes a transistor 300, a transistor 500, and a capacitor 600. FIG. 11A is a cross-sectional view of the transistor 500 in the channel length direction, FIG. 11B is a cross-sectional view of the transistor 500 in the channel width direction, and FIG. 11C is a cross-sectional view of the transistor 300 in the channel width direction.

The transistor 500 is an OS transistor. The transistor 500 has a low off-state current. Therefore, when the structure of the transistor 22 described in the above embodiment is equivalent to that of the transistor 500, for example, a potential can be retained in the node NH for a long period of time. Thus, the frequency of writing of a potential to the node NH is reduced, whereby the power consumption of the semiconductor device can be reduced.

The semiconductor device described in this embodiment includes the transistor 300, the transistor 500, and the capacitor 600, as illustrated in FIG. 9. The transistor 500 is provided above the transistor 300, and the capacitor 600 is provided above the transistor 300 and the transistor 500. For example, the structure of the transistor 23 described in the above embodiment can be equivalent to that of the transistor 300, and the structure of the capacitor 24 can be equivalent to that of the capacitor 600.

The transistor 300 is provided over a substrate 311. The transistor 300 includes a conductor 316 and an insulator 315. The transistor 300 also includes a semiconductor region 313 that is part of the substrate 311, and a low-resistance region 314a and a low-resistance region 314b each functioning as a source region or a drain region.

In the transistor 300, the top surface and the side surface in the channel width direction of the semiconductor region 313 are covered with the conductor 316 with the insulator 315 therebetween, as illustrated in FIG. 11C. In this manner, the effective channel width is increased when the transistor 300 is a Fin type. Thus, the on-state characteristics of the transistor 300 can be improved. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, can be used. Alternatively, a conductive material such as a metal material, an alloy material, or a metal oxide material can be used.

Note that since the work function of the conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 10:
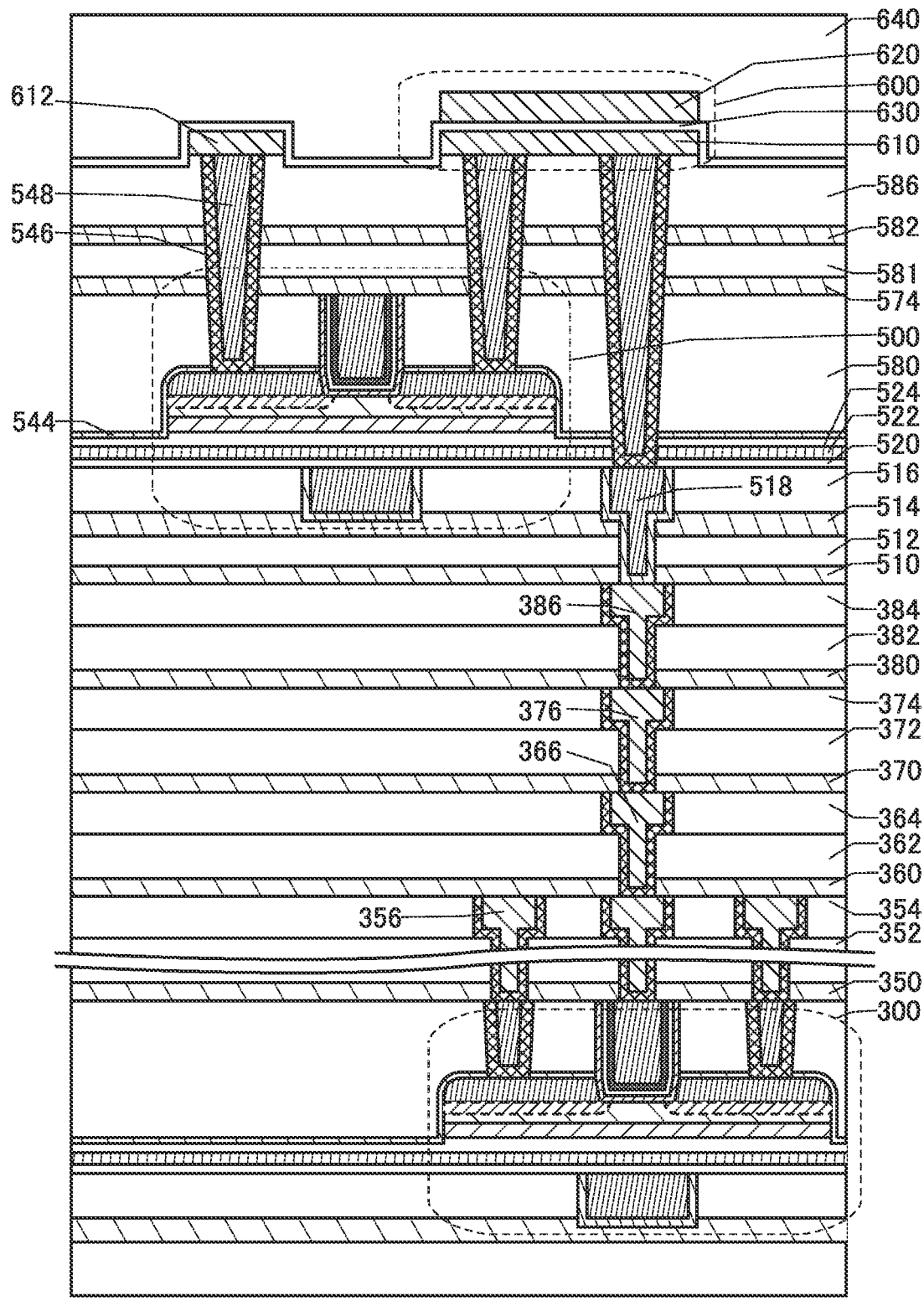
FIG. 10 is a schematic cross-sectional view illustrating a structure example of a semiconductor device.

Note that the structure of the transistor 300 illustrated in FIG. 9 is just an example and the structure is not limited thereto; an appropriate transistor is used in accordance with a circuit structure or an operation method. For example, when a semiconductor device is configured as a single-polarity circuit using only OS transistors, the transistor 300 employs a structure similar to that of the transistor 500 that is an OS transistor, as illustrated in FIG. 10. Note that the details of the transistor 500 are described later. The transistor 300 illustrated in FIG. 10 can be employed for the transistor 23 which is an n-channel transistor illustrated in FIG. 5, for example.

In this specification and the like, a single-polarity circuit refers to a circuit in which all of the transistors have the same polarity, for example. For example, a circuit in which all of the transistors are n-channel transistors can be referred to as a single-polarity circuit.

An insulator 320, an insulator 322, an insulator 324, and an insulator 326 are stacked sequentially and provided to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification and the like, silicon oxynitride refers to a material that contains oxygen at a higher proportion than nitrogen, and silicon nitride oxide refers to a material that contains nitrogen at a higher proportion than oxygen. Furthermore, in this specification and the like, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like provided below the insulator 322. For example, the top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm², preferably less than or equal to $5 \times 10^{15}$ atoms/cm², in the TDS analysis in a film-surface temperature range of 50° C. to 500° C., for example.

Note that the relative permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less that of the insulator 324. When a material with a low relative permittivity is used for an interlayer film, the parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases.

Moreover, in this specification and the like, a wiring and a plug connected to the wiring may be a single component. That is, there are cases where part of a conductor functions as a wiring and part of a conductor functions as a plug.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 9, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to that for the conductor 328 or the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is preferably formed in an opening portion provided in the insulator 350 having a barrier property against hydrogen. With this structure, the transistor 300 and the transistor 500 can be separated by a barrier layer, so that diffusion of hydrogen from the transistor 300 into the transistor 500 can be inhibited.

Note that for the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is retained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 9, an insulator 360, an insulator 362, and an insulator 364 are stacked in this order. Furthermore, a conductor 366 is formed in the insulator 360, the insulator 362, and the insulator 364. The conductor 366 has a function of a plug or a wiring. Note that the conductor 366 can be provided using a material similar to that for the conductor 328 or the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is preferably formed in an opening portion provided in the insulator 360 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 364 and the conductor 366. For example, in FIG. 9, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be provided using a material similar to that for the conductor 328 or the conductor 330.

Note that for example, as the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is preferably formed in an opening portion provided in the insulator 370 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 374 and the conductor 376. For example, in FIG. 9, an insulator 380, an insulator 382, and an insulator 384 are stacked in this order. Furthermore, a conductor 386 is formed in the insulator 380, the insulator 382, and the insulator 384. The conductor 386 has a function of a plug or a wiring. Note that the conductor 386 can be provided using a material similar to that for the conductor 328 or the conductor 330.

Note that for example, as the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is preferably formed in an opening portion provided in the insulator 380 having a barrier property against hydrogen. With this structure, the transistor 300 and the transistor 500 can be separated by a barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially and provided over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 300 is provided, or the like into the region where the transistor 500 is provided. Therefore, a material similar to that for the insulator 324 is preferably used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors in a change in electrical characteristics of the transistor. Accordingly, aluminum oxide can prevent mixing of impurities such as hydrogen and moisture into the transistor 500 in the fabrication process and after the fabrication of the transistor. In addition, release of oxygen from the metal oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low dielectric constant is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503, for example), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to that for the conductor 328 or the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by a layer having a barrier property against oxygen, hydrogen, and water; thus, diffusion of hydrogen from the transistor 300 into the transistor 500 can be inhibited.

The transistor 500 is provided above the insulator 514.

As illustrated in FIG. 11A and FIG. 11B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned to include a region in contact with the bottom surface and the side surface of the opening, an insulator 550 positioned on the formation surface of the oxide 530c, and a conductor 560 positioned on the formation surface of the insulator 550.

As illustrated in FIG. 11A and FIG. 11B, an insulator 544 is preferably provided between the insulator 580 and the oxide 530a, the oxide 530b, the conductor 542a, and the conductor 542b. In addition, as illustrated in FIG. 11A and FIG. 11B, the conductor 560 preferably includes a conductor 560a provided inside the insulator 550 and a conductor 560b embedded inside the conductor 560a. As illustrated in FIG. 11A and FIG. 11B, an insulator 574 is preferably provided over the oxide 530c, the insulator 580, the conductor 560, and the insulator 550.

Note that in the following description, the oxide 530a, the oxide 530b, and the oxide 530c are sometimes collectively referred to as an oxide 530.

Note that although a structure of the transistor 500 in which three layers of the oxide 530a, the oxide 530b, and the oxide 530c are stacked in a region where a channel is formed and its vicinity is shown, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 9, FIG. 10, FIG. 11A, and FIG. 11B is an example, and the structure is not limited thereto; an appropriate transistor can be used in accordance with a circuit configuration or an operation method.

Here, the conductor 560 functions as a gate electrode of the transistor 500, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to include a region overlapping with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (s-channel) structure.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material which has a function of inhibiting diffusion of impurities such as a hydrogen atom, a hydrogen molecule, a water molecule, and a copper atom (through which the impurities are less likely to pass) is preferably used. Alternatively, it is preferable to use a conductive material which has a function of inhibiting diffusion of oxygen (e.g., at least one of an oxygen atom, an oxygen molecule, and the like) (through which the oxygen is less likely to pass). Note that in this specification and the like, a function of inhibiting diffusion of impurities or oxygen means a function of inhibiting diffusion of any one or all of the above impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. In that case, the conductor 503a is not necessarily provided. Note that the conductor 503b is a single layer in the diagram but may have a stacked-layer structure, for example, a stack of any of the above conductive materials and titanium or titanium nitride.

The insulator 520, the insulator 522, and the insulator 524 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^{-3}$, preferably greater than or equal to $1.0\times10^{19}$ atoms/cm$^{-3}$, further preferably greater than or equal to $2.0\times10^{19}$ atoms/cm$^{-3}$ or greater than or equal to $3.0\times10^{20}$ atoms/cm$^{-3}$ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_oH$ is cut occurs, i.e., when a reaction of "$V_oH \rightarrow V_o+H$" occurs. Part of hydrogen generated at this time is bonded to oxygen to be $H_2O$, and removed from the oxide 530 or an insulator in the vicinity of the oxide 530 in some cases. Part of hydrogen is diffused into or gettered by the conductor 542 in some cases.

For the microwave treatment, for example, an apparatus including a power supply that generates high-density plasma or an apparatus including a power supply that applies RF to the substrate side is suitably used. Oxygen radicals at a high density can be generated when gas containing oxygen and high-density plasma are used. By applying RF to the substrate side, the oxygen radicals generated by high-density plasma can be introduced into the oxide 530 or the insulator in the vicinity of the oxide 530 efficiently. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a fabrication process of the transistor 500, the heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_o$). Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is performed in a nitrogen gas or inert gas atmosphere.

Note that oxygen supplying treatment performed on the oxide 530 can promote a reaction in which oxygen vacancies in the oxide 530 are filled with supplied oxygen, i.e., a reaction of "$V_o+O \rightarrow null$". Furthermore, hydrogen remaining in the oxide 530 reacts with oxygen supplied to the oxide 530, so that the hydrogen can be removed as $H_2O$ (dehydration). This can inhibit recombination of hydrogen remaining in the oxide 530 with oxygen vacancies and formation of $V_oH$.

In addition, in the case where the insulator 524 includes an excess-oxygen region, it is preferable that the insulator 522 have a function of inhibiting diffusion of oxygen (e.g., an oxygen atom, an oxygen molecule, or the like) (or that the insulator 522 be less likely to transmit the oxygen).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530, which is preferable.

The insulator 522 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or ($Ba,Sr)TiO_3$ (BST). As miniaturization and high integration of transistors progress, a problem such as generation of leakage current may arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (i.e., an insulating material through which the oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and a high relative permittivity.

Note that the transistor 500 in FIG. 11A and FIG. 11B includes the insulator 520, the insulator 522, and the insulator 524 as the second gate insulating film having a three-layer structure; however, the second gate insulating film may have a single-layer structure, a two-layer structure, or a stacked-layer structure of four or more layers. In that case, without limitation to a stacked-layer structure formed of the same material, a stacked-layer structure formed of different materials may be employed.

In the transistor 500, a metal oxide functioning as an oxide semiconductor is preferably used for the oxide 530 including the channel formation region. For example, for the oxide 530, a metal oxide such as an In-M-Zn oxide (the element M is one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the In-M-Zn oxide which can be used for the oxide 530 is preferably a CAAC-OS (C-Axls Aligned Crystal Oxide Semiconductor) or a CAC-OS (Cloud-Aligned Composite Oxide Semiconductor). Furthermore, for the oxide 530, an In—Ga oxide or an In—Zn oxide may be used. The CAAC-OS and the CAC-OS will be described later.

Furthermore, a metal oxide with a low carrier concentration is preferably used for the transistor 500. In the case where the carrier concentration of the metal oxide is reduced, the concentration of impurities in the metal oxide is reduced so that the density of defect states is reduced. In this specification and the like, a state with a low impurity concentration and a low density of defect states is referred to as a highly purified intrinsic or substantially highly purified intrinsic state. As examples of the impurities in the metal oxide, hydrogen, nitrogen, alkali metal, alkaline earth metal, iron, nickel, silicon, and the like are given.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form $V_oH$ in some cases. The $V_oH$ serves as a donor and an electron that is a carrier is generated in some cases. In other cases, bonding of part of hydrogen to oxygen bonded to a metal atom generates electrons serving as carriers. Thus, a transistor using a metal oxide containing much hydrogen is likely to have normally-on characteristics. Moreover, hydrogen in a metal oxide easily moves by stress such as heat and an electric field; thus, the reliability of a transistor may be low when the metal oxide contains plenty of hydrogen. In one embodiment of the present invention, $V_oH$ in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose $V_oH$ is sufficiently reduced. When a metal oxide in which impurities such as $V_oH$ are sufficiently reduced is used for a channel formation region of a transistor, stable electrical characteristics can be given.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Therefore, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^{-3}$, preferably lower than $1 \times 10^{19}$ atoms/cm$^{-3}$, further preferably lower than $5 \times 10^{18}$ atoms/cm$^{-3}$, still further preferably lower than $1 \times 10^{18}$ atoms/cm$^{-3}$. When a metal oxide in which impurities such as hydrogen are sufficiently reduced is used for a channel formation region of a transistor, stable electrical characteristics can be given.

When a metal oxide is used for the oxide 530, the carrier concentration of the metal oxide in the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration of the metal oxide in the channel formation region is not particularly limited and can be, for example, $1 \times 10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be rephrased as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b and between the conductor 542b and the oxide 530b. The layer contains more oxygen than the conductor 542 does, and thus the layer presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having an MIS structure as its main part.

Note that the layer is not limited to be formed between the conductor 542 and the oxide 530b. For example, the layer is formed between the conductor 542 and the oxide 530c in some cases. Alternatively, the layer is formed between the conductor 542 and the oxide 530b and between the conductor 542 and the oxide 530c in some cases.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, when the oxide 530 includes the oxide 530c over the oxide 530b, it is possible to inhibit diffusion of impurities into the oxide 530b from the components formed above the oxide 530c.

Note that the oxide 530 preferably has a stacked-layer structure of oxides that differ in the atomic ratio of metal atoms. Specifically, the atomic proportion of the element M in constituent elements in the metal oxide used for the oxide 530a is preferably greater than the atomic proportion of the element M in constituent elements in the metal oxide used for the oxide 530b. In addition, the atomic ratio of the element M to In in the metal oxide used for the oxide 530a is preferably higher than the atomic ratio of the element M to In in the metal oxide used for the oxide 530b. Furthermore, the atomic ratio of In to the element M in the metal oxide used for the oxide 530b is preferably higher than the atomic ratio of In to the element M in the metal oxide used for the oxide 530a. Moreover, a metal oxide that can be used for the oxide 530a or the oxide 530b can be used for the oxide 530c.

Specifically, for the oxide 530a, a metal oxide having In:Ga:Zn=1:3:4 [atomic ratio] or a composition in the vicinity thereof, or 1:1:0.5 [atomic ratio] or a composition in the vicinity thereof is used. For the oxide 530b, a metal oxide having In:Ga:Zn=4:2:3 [atomic ratio] or a composition in the vicinity thereof, In:Ga:Zn=5:1:3 [atomic ratio] or a composition in the vicinity thereof, or 1:1:1 [atomic ratio] or a composition in the vicinity thereof is used. For the oxide 530c, a metal oxide having In:Ga:Zn=1:3:4 [atomic ratio] or a composition in the vicinity thereof, Ga:Zn=2:1 [atomic ratio] or a composition in the vicinity thereof, or Ga:Zn=2:5 [atomic ratio] or a composition in the vicinity thereof is used. Specific examples of the oxide 530c having a stacked-layer structure include a stacked-layer structure of In:Ga:Zn=4:2:3 [atomic ratio] or a composition in the vicinity thereof and In:Ga:Zn=1:3:4 [atomic ratio] or a composition in the vicinity thereof, a stacked-layer structure of Ga:Zn=2:1 [atomic ratio] or a composition in the vicinity thereof and In:Ga:Zn=4:2:3 [atomic ratio] or a composition in the vicinity thereof, a stacked-layer structure of Ga:Zn=2:5 [atomic ratio] or a composition in the vicinity thereof and In:Ga:Zn=4:2:3 [atomic ratio] or a composition in the vicinity thereof, and a stacked-layer structure of gallium oxide and In:Ga:Zn=4:2:3 [atomic ratio] or a composition in the vicinity thereof. Note that a composition in the vicinity includes ±30% of an intended atomic ratio.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at an interface between the oxide 530a and the oxide 530b and an interface between the oxide 530b and the oxide 530c are preferably made low.

Specifically, when the oxide 530a and the oxide 530b as well as the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

Note that semiconductor materials that can be used for the oxide 530 are not limited to the above metal oxides. A semiconductor material having a band gap (a semiconductor material that is not a zero-gap semiconductor) may be used for the oxide 530. For example, a single element semiconductor such as silicon, a compound semiconductor such as gallium arsenide, or a layered material (also referred to as an atomic layered material or a two-dimensional material) functioning as a semiconductor is preferably used as the semiconductor material. In particular, a layered material functioning as a semiconductor is preferably used as the semiconductor material.

Here, in this specification and the like, a layered material generally refers to a group of materials having a layered crystal structure. The layered crystal structure is a structure in which layers formed by covalent bonding or ionic bonding are stacked with bonding such as the Van der Waals force, which is weaker than covalent bonding or ionic bonding. The layered material has high electrical conductivity in a monolayer, that is, the two-dimensional electrical conductivity is high. When a material that functions as a semiconductor and has high two-dimensional electrical conductivity is used for a channel formation region, a transistor with a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide ($W_{52}$), tungsten selenide (typically $WSe_2$), tungsten telluride (typically $WTe_2$), hafnium sulfide ($HfS_2$), hafnium selenide ($HfSe_2$), zirconium sulfide ($ZrS_2$), and zirconium selenide ($ZrSe_2$).

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 11, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 11A, a region 543a and a region 543b are sometimes formed as low-resistance regions in the oxide 530 at and near the interface with the conductor 542a (the conductor 542b). In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover the side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), for the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately determined in consideration of required transistor characteristics.

When the insulator 544 is included, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with the inner side (the top surface and the side surface) of the metal oxide 530c. Like the insulator 524, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride are preferable because they are thermally stable.

When an insulator that releases oxygen by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

Furthermore, to efficiently supply excess oxygen contained in the insulator 550 to the oxide 530, a metal oxide may be provided between the insulator 550 and the conductor 560. The metal oxide preferably has a function of inhibiting oxygen diffusion from the insulator 550 into the conductor 560. Providing the metal oxide having a function of inhibiting diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. As the metal oxide, a material that can be used for the insulator 544 is used.

Note that the insulator 550 may have a stacked-layer structure like the second gate insulating film. As miniaturization and high integration of transistors progress, a problem such as generation of leakage current may arise because of a thinner gate insulating film. When the insulator functioning as the gate insulating film has a stacked-layer structure of a high-k material and a thermally stable material, a gate potential during operation of the transistor can be reduced while the physical thickness is maintained. Furthermore, the stacked-layer structure can be thermally stable and have a high relative permittivity.

Although the conductor 560 functioning as the first gate electrode has a two-layer structure in FIG. 11A and FIG. 11B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, the conductor 560a is preferably formed using a conductive material having a function of inhibiting diffusion of oxygen (e.g., at least one of oxygen atoms and oxygen molecules). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting oxygen diffusion, tantalum, tantalum nitride, ruthenium, or ruthenium oxide is preferably used, for example. For the conductor 560a, the oxide semiconductor that can be used for the oxide 530 can be used. In that case, when the conductor 560b is deposited by a sputtering method, the conductor 560a can have a reduced electric resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used for the conductor 560b. For example, a conductive material containing tungsten, copper, or aluminum as its main component can be used. The conductor 560b may have a stacked-layer structure, for example, a stacked-layer structure of titanium or titanium nitride and any of the above conductive materials.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided to include a region in contact with the oxide 530c, oxygen in the insulator 580 can be efficiently supplied to the oxide 530a and the oxide 530b through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio.

In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Accordingly, oxygen can be supplied from the excess-oxygen regions into the oxide 530.

For example, a metal oxide containing one kind or two or more kinds selected from hafnium, aluminum, gallium, yttrium, zirconium, tungsten, titanium, tantalum, nickel, germanium, magnesium, and the like can be used for the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water and hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors in a change in electrical characteristics of the transistor. Accordingly, aluminum oxide can prevent mixing of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

In addition, an insulator 586 is provided over the insulator 582. For the insulator 586, a material similar to that for the insulator 320 can be used. Furthermore, when a material with a comparatively low dielectric constant is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using a material similar to that for the conductor 328 or the conductor 330.

Note that after the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 514 or the insulator 522 and the formation of the insulator having a high barrier property in contact with the insulator 514 or the insulator 522 are suitable because these formation steps can also serve as some of the fabrication steps of the transistor 500. The insulator having a high barrier property against hydrogen or water is provided using a material similar to that for the insulator 522, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, a conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added can be used.

The conductor 612 and the conductor 610 each have a single-layer structure in FIG. 9; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

Using the structure, a semiconductor device using a transistor including an oxide semiconductor can be miniaturized or highly integrated.

Figure 12A:
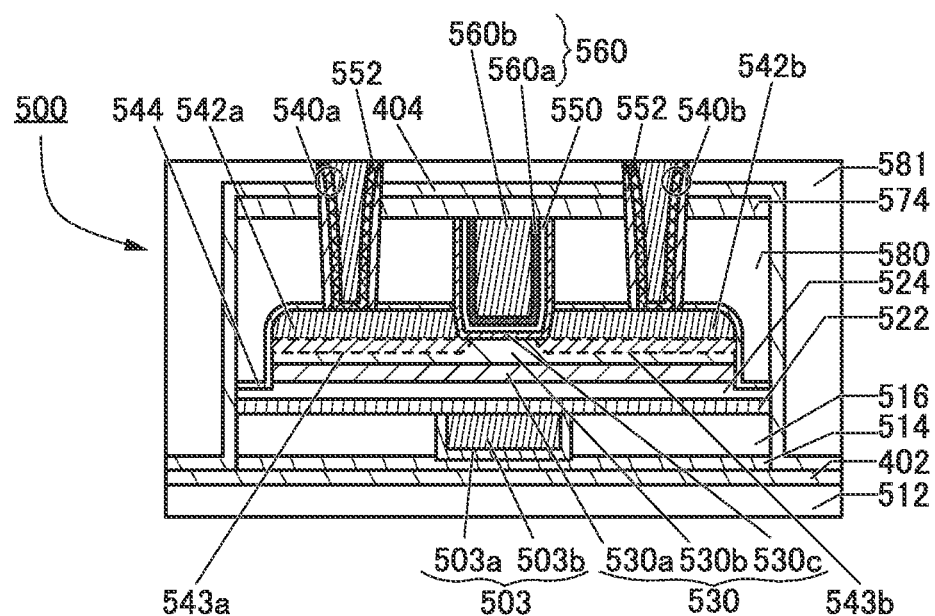
FIG. 12A and FIG. 12B are schematic cross-sectional views illustrating a structure example of a transistor.
Figure 12B:
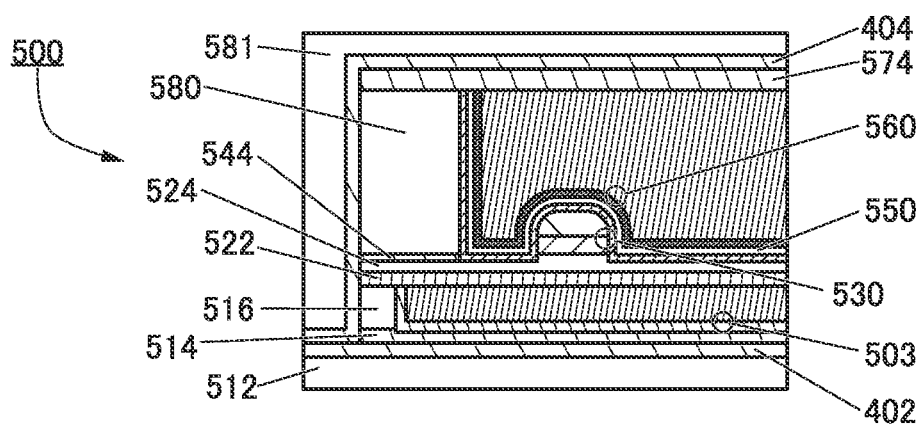

FIG. 12A and FIG. 12B illustrate a modification example of the transistor 500 illustrated in FIG. 11A and FIG. 11B. FIG. 12A is a cross-sectional view of the transistor 500 in the channel length direction, and FIG. 12B is a cross-sectional view of the transistor 500 in the channel width direction. The transistor 500 illustrated in FIG. 12A and FIG. 12B is different from the transistor 500 illustrated in FIG. 11A and FIG. 11B in that an insulator 402 and an insulator 404 are included. Furthermore, the transistor 500 illustrated in FIG. 12A and FIG. 12B is different from the transistor 500 illustrated in FIG. 11A and FIG. 11B in that an insulator 552 is provided in contact with the side surface of the conductor 540a and the insulator 552 is provided in contact with the side surface of the conductor 540b. Moreover, the transistor 500 illustrated in FIG. 12A and FIG. 12B is different from the transistor 500 illustrated in FIG. 11A and FIG. 11B in that the insulator 520 is not included. Note that the structure illustrated in FIG. 12A and FIG. 12B can also be employed for other transistors, such as the transistor 300, included in the semiconductor device of one embodiment of the present invention.

In the transistor 500 illustrated in FIG. 12A and FIG. 12B, the insulator 402 is provided over the insulator 512. The insulator 404 is provided over the insulator 574 and the insulator 402.

In the transistor 500 illustrated in FIG. 12A and FIG. 12B, the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, the side surface of the insulator 574, the side surface of the insulator 580, the side surface of the insulator 544, the side surface of the insulator 524, the side surface of the insulator 522, the side surface of the insulator 516, the side surface of the insulator 514, and the top surface of the insulator 402. Thus, the oxide 530 and the like are isolated from the outside by the insulator 404 and the insulator 402.

It is preferable that the insulator 402 and the insulator 404 have high capability of inhibiting diffusion of hydrogen (e.g., at least one of a hydrogen atom, a hydrogen molecule, and the like) or a water molecule. For example, for the insulator 402 and the insulator 404, silicon nitride or silicon nitride oxide that is a material having a high hydrogen barrier property is preferably used. This can inhibit the diffusion of hydrogen or the like into the oxide 530, whereby the degradation of the characteristics of the transistor 500 can be inhibited. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting the diffusion of hydrogen or water molecules. For example, for the insulator 552, an insulator such as silicon nitride, aluminum oxide, or silicon nitride oxide that is a material having a high hydrogen barrier property is preferably used. In particular, silicon nitride is suitably used for the insulator 552 because of its high hydrogen barrier property. By using a material having a high hydrogen barrier property for the insulator 552, the diffusion of impurities such as water or hydrogen from the insulator 580 and the like into the oxide 530 through the conductor 540a or the conductor 540b can be inhibited. Furthermore, oxygen contained in the insulator 580 can be prevented from being absorbed by the conductor 540a and the conductor 540b. Consequently, the reliability of the semiconductor device of one embodiment of the present invention can be increased.

Figure 13:
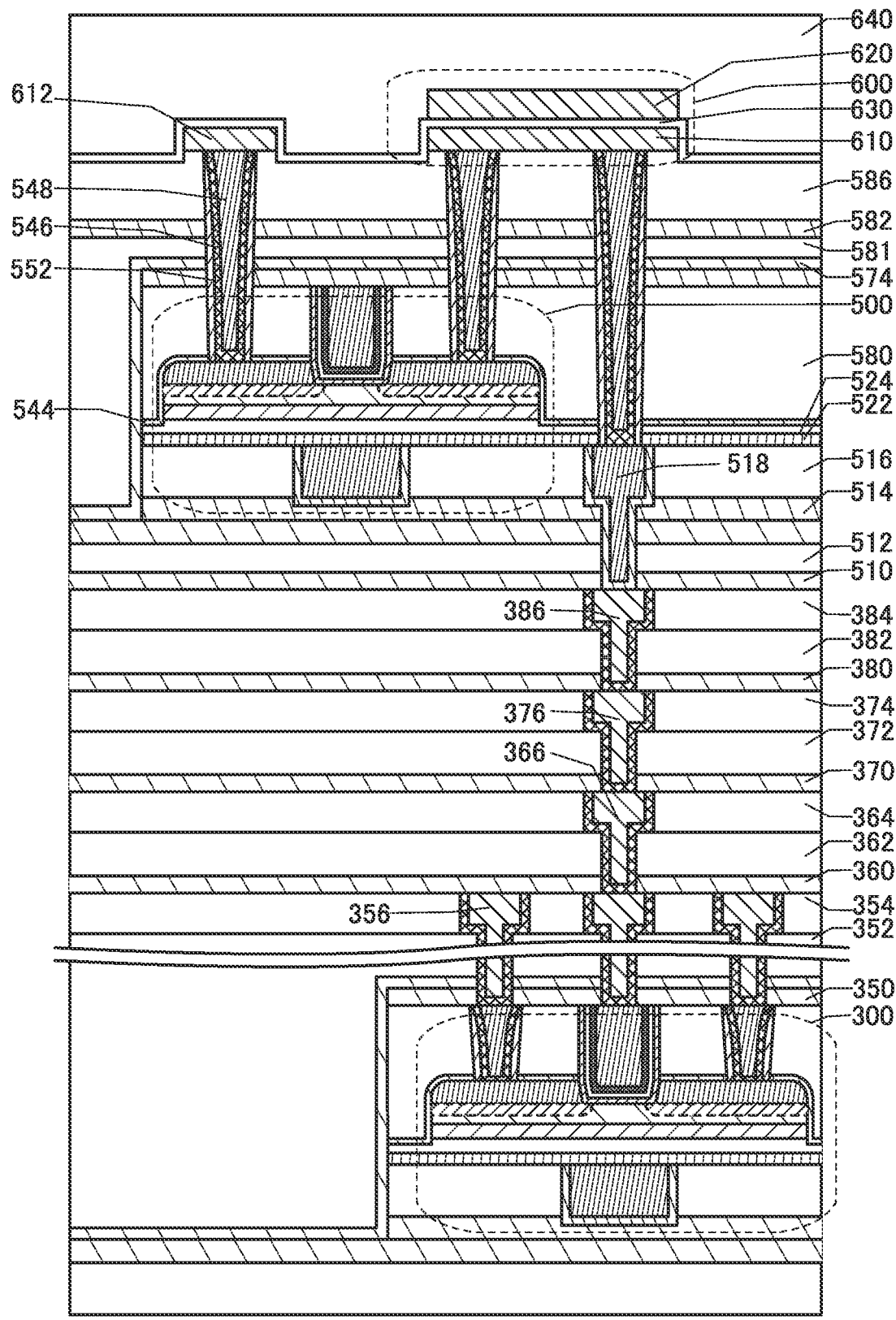
FIG. 13 is a schematic cross-sectional view illustrating a structure example of a semiconductor device.

FIG. 13 is a cross-sectional view illustrating a structure example of the semiconductor device in the case where the transistor 500 and the transistor 300 have the structure illustrated in FIG. 12A and FIG. 12B. The insulator 552 is provided on the side surface of the conductor 546.

Figure 14A:
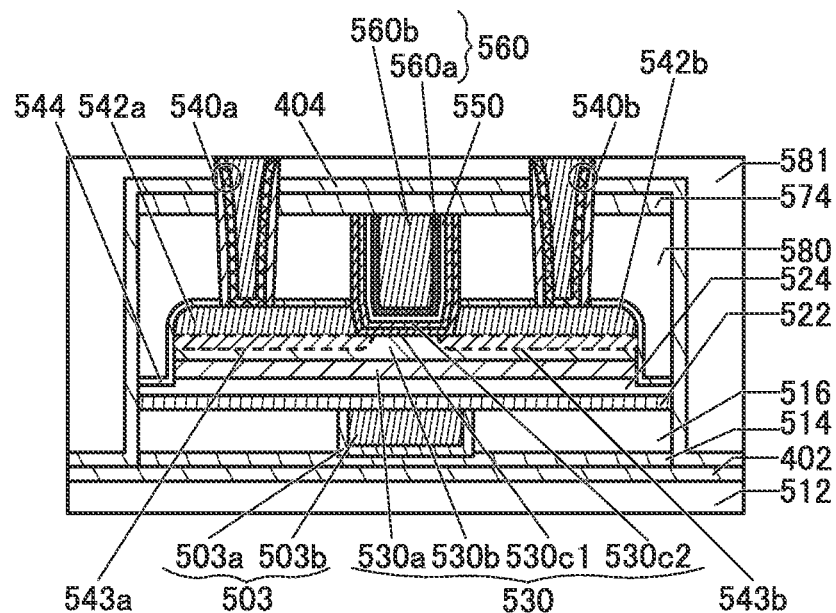
FIG. 14A and FIG. 14B are schematic cross-sectional views illustrating a structure example of a transistor.
Figure 14B:
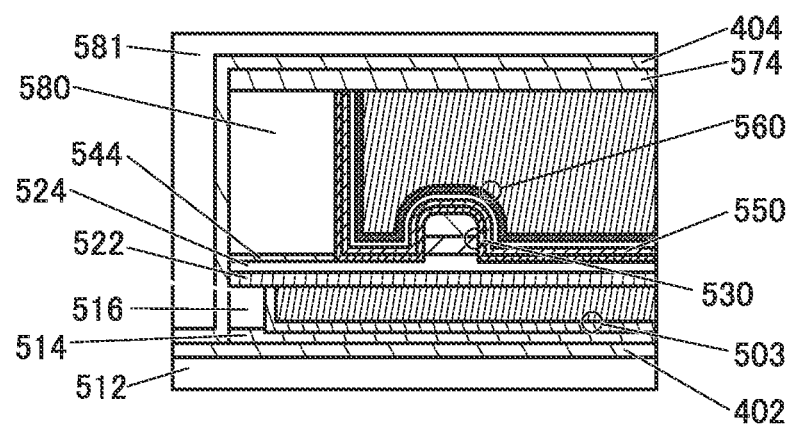

FIG. 14A and FIG. 14B illustrate a modification example of the transistor illustrated in FIG. 12A and FIG. 12B. FIG. 14A is a cross-sectional view of the transistor in the channel length direction and FIG. 14B is a cross-sectional view of the transistor in the channel width direction. The transistor illustrated in FIG. 14A and FIG. 14B is different from the transistor illustrated in FIG. 12A and FIG. 12B in that the oxide 530c has a two-layer structure of an oxide 530c1 and an oxide 530c2.

The oxide 530c1 is in contact with the top surface of the insulator 524, the side surface of the oxide 530a, the top surface and the side surface of the oxide 530b, the side surfaces of the conductor 542a and the conductor 542b, the side surface of the insulator 544, and the side surface of the insulator 580. The oxide 530c2 is in contact with the insulator 550.

An In—Zn oxide can be used for the oxide 530c1, for example. For the oxide 530c2, it is possible to use a material similar to the material that can be used for the oxide 530c when the oxide 530c has a single-layer structure. For the oxide 530c2, a metal oxide having In:Ga:Zn=1:3:4 [atomic ratio] or a composition in the vicinity thereof, Ga:Zn=2:1 [atomic ratio] or a composition in the vicinity thereof, or Ga:Zn=2:5 [atomic ratio] or a composition in the vicinity thereof can be used, for example.

When the oxide 530c has a two-layer structure of the oxide 530c1 and the oxide 530c2, the on-state current of the transistor can be increased as compared with the case where the oxide 530c has a single-layer structure. Thus, the transistor can be a power MOS transistor, for example. Note that the oxide 530c included in the transistor illustrated in FIG. 11A and FIG. 11B can also have a two-layer structure of the oxide 530c1 and the oxide 530c2.

The transistor illustrated in FIG. 14A and FIG. 14B can be used as the transistor 300, for example. As described above, the transistor 300 can be used as the transistor 23 illustrated in FIG. 5 in the above embodiment. As described above, the transistor 300 having the structure illustrated in FIG. 14A and FIG. 14B has high on-state current. Thus, when the transistor 23 functioning as an output transistor has the structure illustrated in FIG. 14A and FIG. 14B, the on-state current of the transistor 23 can be increased. Thus, the accuracy of the potential output from the semiconductor device of one embodiment of the present invention can be increased. Note that the structure illustrated in FIG. 14A and FIG. 14B can also be employed for transistors other than the transistor 300, such as the transistor 500, included in the semiconductor device of one embodiment of the present invention.

Figure 15:
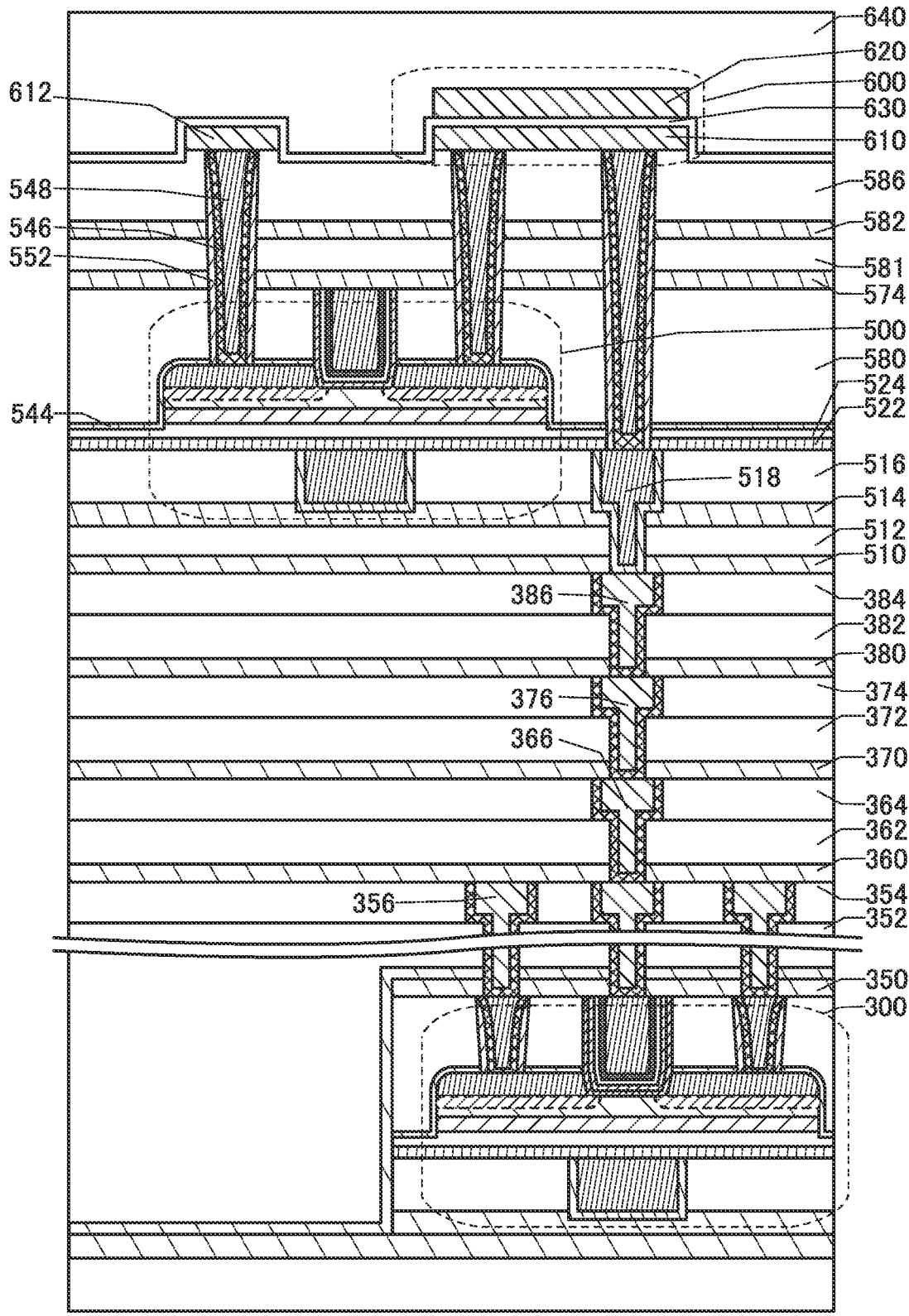
FIG. 15 is a schematic cross-sectional view illustrating a structure example of a semiconductor device.

FIG. 15 is a cross-sectional view illustrating a structure example of the semiconductor device when the transistor 500 has the structure illustrated in FIG. 11A and FIG. 11B and the transistor 300 has the structure illustrated in FIG. 14A and FIG. 14B. Note that a structure is employed where the insulator 552 is provided on the side surface of the conductor 546 as in FIG. 13. As illustrated in FIG. 15, in the semiconductor device of one embodiment of the present invention, both the transistor 300 and the transistor 500 can be OS transistors while having different structures from each other.

Figure 16A:
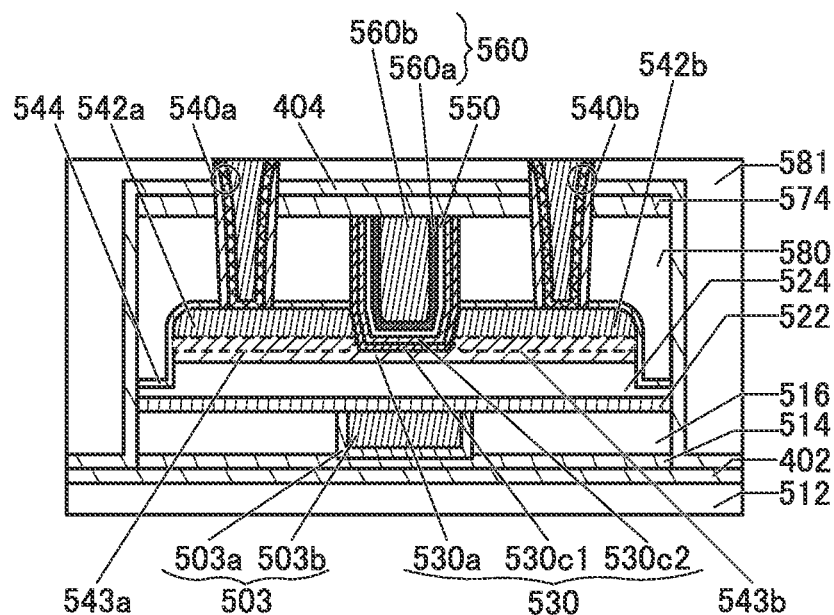
FIG. 16A and FIG. 16B are schematic cross-sectional views illustrating a structure example of a transistor.
Figure 16B:
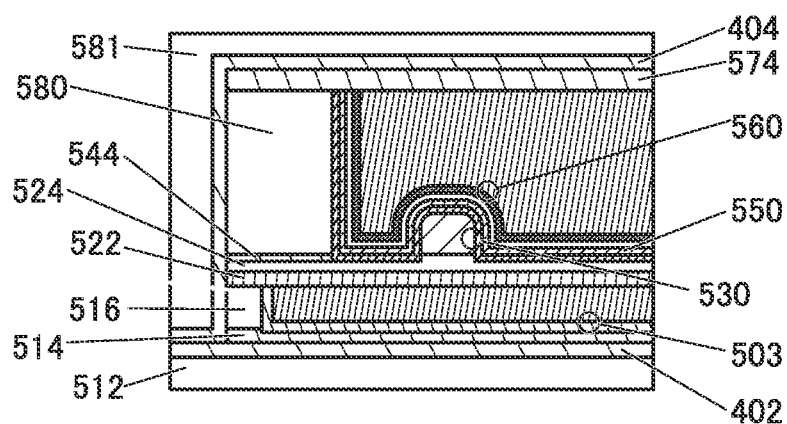

FIG. 16A and FIG. 16B illustrate a modification example of the transistor illustrated in FIG. 14A and FIG. 14B. FIG. 16A is a cross-sectional view of the transistor in the channel length direction and FIG. 16B is a cross-sectional view of the transistor in the channel width direction. The transistor illustrated in FIG. 16A and FIG. 16B is different from the transistor illustrated in FIG. 14A and FIG. 14B in that the oxide 530b is not included. That is, it can be said that the oxide 530 in the transistor illustrated in FIG. 16A and FIG. 16B includes the oxide 530a, the oxide 530c1, and the oxide 530c2.

When the oxide 530 has a stacked-layer structure of the oxide 530a, the oxide 530c1, and the oxide 530c2, the following excellent effects can be achieved.

For example, when the oxide 530a has In:Ga:Zn=1:3:4 [atomic ratio] or a composition in the vicinity thereof, the oxide 530c1 has In:Ga:Zn=4:2:3 [atomic ratio] or a composition in the vicinity thereof, and the oxide 530c2 has In:Ga:Zn=1:3:4 [atomic ratio] or a composition in the vicinity thereof, a channel formation region can be provided in the oxide 530c1. In the case of this structure, the oxide 530c1 and the oxide 530c2 are formed to have a U-shape along an opening portion formed in the insulator 580, the insulator 544, the conductor 542a, the conductor 542b, and the oxide 530a. Note that the opening portion formed in the oxide 530a does not reach the top surface of the insulator 524. Furthermore, the side surface of the conductor 542a and the side surface of the conductor 542b can be in contact with the side surfaces of the oxide 530c1. Moreover, the oxide 530c2 is in contact with the top surface of the oxide 530c1, whereby the insulator 550 can be prevented from being in contact with the oxide 530c1.

In the above-described structure, the contact area between the oxide 530c1, and the conductor 542a and the conductor 542b can be small. This small contact area between the oxide 530c1, and the conductor 542a and the conductor 542b leads to a reduced junction leakage current that might be generated between the conductor 542 and the oxide 530c1. The contact area between the conductor 542 and the oxide 530c1 can be appropriately adjusted by adjusting the thickness of the conductor 542.

For example, the semiconductor device including the transistor having the structure illustrated in FIG. 16 can be suitably used in the case of being used in space. For example, the transistor having the structure illustrated in FIG. 16 can be used as a transistor included in a semiconductor device provided in an artificial satellite. In space, cosmic radiation, or electrons and protons ejected from the sun might enter the inside of a semiconductor device to affect the semiconductor characteristics. Since the junction leakage current in the transistor having the structure illustrated in FIG. 16 is reduced, the transistor is highly resistant to cosmic radiation and the like and can be deemed to have a highly reliable structure.

This embodiment can be implemented in an appropriate combination with the structures described in the other embodiments and the like.

Embodiment 3

In this embodiment, the compositions of a CAC-OS and a CAAC-OS which are metal oxides that can be used in the OS transistor described in the above embodiments, will be described. Note that in this specification and the like, the CAC refers to an example of a function or a material composition, and the CAAC refers to an example of a crystal structure.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current drive capability in the on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to the low density of oxygen atom arrangement in the a-b plane direction, a change in interatomic bond distance by replacement of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. When indium in the In layer is replaced with the element M, the layer can be referred to as an (In,M) layer.

The CAAC-OS is an oxide semiconductor with high crystallinity. Meanwhile, in the CAAC-OS, a reduction in electron mobility due to a crystal grain boundary is less likely to occur because a clear crystal grain boundary cannot be observed. Entry of impurities, formation of defects, or the like might decrease the crystallinity of the oxide semiconductor; thus, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor that has a structure between those of the nc-OS and the amorphous oxide semiconductor. The a-like OS includes a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

Note that when the above oxide semiconductor is used for a transistor, a transistor with high field-effect mobility can be achieved. In addition, a transistor having high reliability can be achieved.

An oxide semiconductor with a low carrier concentration is preferably used for a transistor. In the case where the carrier concentration of an oxide semiconductor is lowered, the impurity concentration in the oxide semiconductor is lowered to decrease the density of defect states. In this specification and the like, a state with a low impurity concentration and a low density of defect states is referred to as a highly purified intrinsic or substantially highly purified intrinsic state.

A highly purified intrinsic or substantially highly purified intrinsic oxide semiconductor has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to stabilize the electrical characteristics of the transistor, reducing the impurity concentration in the oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set to lower than or equal to $2\times10^{18}$ atoms/cm$^{-3}$, preferably lower than or equal to $2\times10^{17}$ atoms/cm$^{-3}$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set to lower than or equal to $1\times10^{18}$ atoms/cm$^{-3}$, preferably lower than or equal to $2\times10^{16}$ atoms/cm$^{-3}$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set to, for example, lower than $5\times10^{19}$ atoms/cm$^{-3}$, preferably lower than or equal to $5\times10^{18}$ atoms/cm$^{-3}$, further preferably lower than or equal to $1\times10^{18}$ atoms/cm$^{-3}$, still further preferably lower than or equal to $5\times10^{17}$ atoms/cm$^{-3}$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set to lower than $1\times10^{20}$ atoms/cm$^{-3}$, preferably lower than $1\times10^{19}$ atoms/cm$^{-3}$, further preferably lower than $5\times10^{18}$ atoms/cm$^{-3}$, still further preferably lower than $1\times10^{18}$ atoms/cm$^{-3}$.

When an oxide semiconductor with sufficiently reduced impurities is used for the channel formation region of the transistor, stable electrical characteristics can be given.

This embodiment can be implemented in an appropriate combination with the structures described in the other embodiments and the like.

Embodiment 4

This embodiment will show examples of a semiconductor wafer where the semiconductor device or the like described in the above embodiment is formed and electronic components incorporating the semiconductor device.
<Semiconductor Wafer>

First, an example of a semiconductor wafer where the semiconductor device or the like is formed is described with reference to FIG. 17A.

Figure 17A:
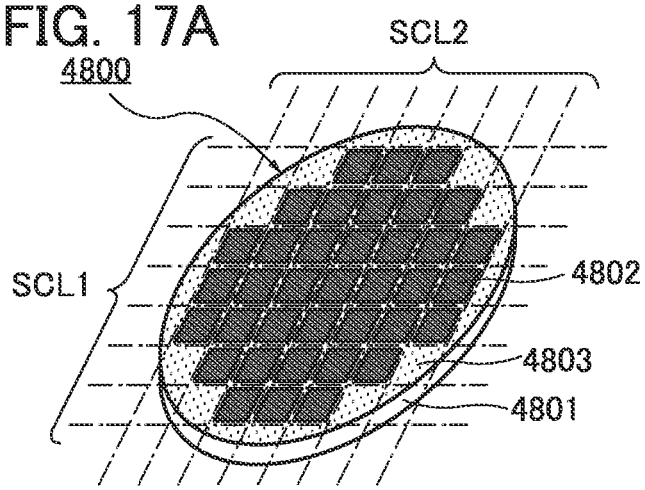
FIG. 17A and FIG. 17B are perspective views illustrating an example of a semiconductor wafer.

A semiconductor wafer 4800 shown in FIG. 17A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided such that a plurality of scribe lines SCL1 are parallel to each other, a plurality of scribe lines SCL2 are parallel to each other, and the scribe lines SCL1 are perpendicular to the scribe lines SCL2.

Figure 17B:
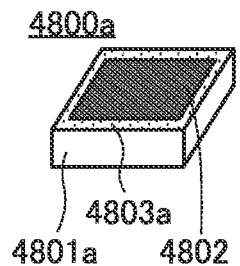

With the dicing step, a chip 4800a as shown in FIG. 17B can be cut out from the semiconductor wafer 4800. The chip 4800a includes a wafer 4801a, the circuit portion 4802, and a spacing 4803a. Note that it is preferable to make the spacing 4803a as small as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 shown in FIG. 17A. The element substrate may be a rectangular semiconductor wafer, for example. The shape of the element substrate can be changed as appropriate, depending on a process for fabricating an element and an apparatus for fabricating the element.
<Electronic Components>

Next, examples of electronic components incorporating the chip 4800a are described with reference to FIG. 17C and FIG. 17D.

Figure 17C:
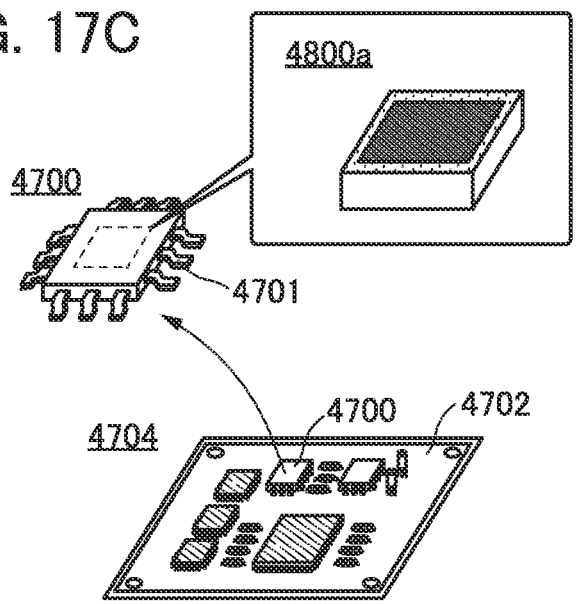
FIG. 17C and FIG. 17D are perspective views illustrating examples of electronic components.

FIG. 17C is a perspective view of an electronic component 4700 and a substrate (a mounting board 4704) on which the electronic component 4700 is mounted. The electronic component 4700 shown in FIG. 17C includes a lead 4701 and the above-described chip 4800a, and functions as an IC chip or the like.

The electronic component 4700 can be formed by, for example, a wire bonding step of electrically connecting the lead 4701 of a lead frame to an electrode on the chip 4800a with a metal fine line (wire), a molding step of performing sealing with an epoxy resin or the like, a plating step on the lead 4701 of the lead frame, and a printing step on a surface of the package. Ball bonding or wedge bonding, for example, can be used in the wire bonding step. Although a QFP (Quad Flat Package) is used as the package of the electronic component 4700 in FIG. 17C, the mode of the package is not limited thereto.

The electronic component 4700 is mounted on a printed circuit board 4702, for example. A plurality of such IC chips are combined and electrically connected to each other on the printed circuit board 4702, whereby the mounting board 4704 is completed.

Figure 17D:
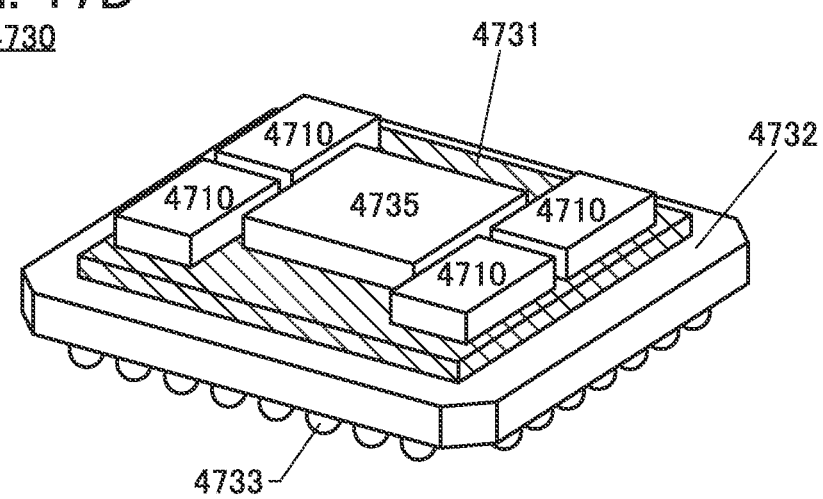

FIG. 17D is a perspective view of an electronic component 4730. The electronic component 4730 is an example of a SiP (System in Package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

Examples of the semiconductor devices 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is sometimes referred to as a "redistribution substrate" or an "intermediate substrate". A through electrode may be provided in the interposer 4731 and used to electrically connect an integrated circuit and the package substrate 4732. For a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 17D shows an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be implemented in an appropriate combination with the structures described in the other embodiments and the like.

Embodiment 5

Figure 18:
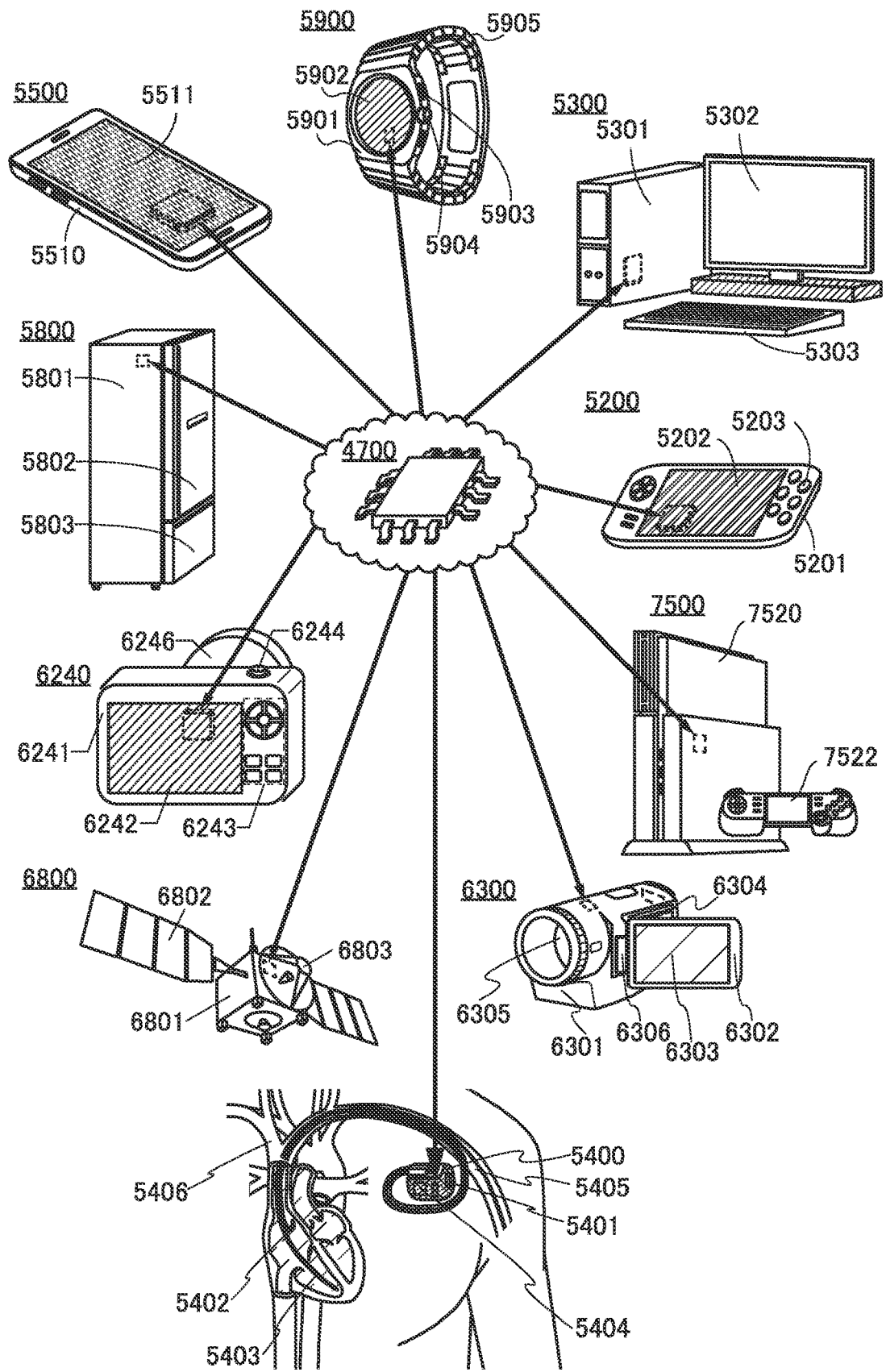
FIG. 18 is perspective views and schematic views illustrating examples of appliances.

In this embodiment, examples of electronic devices each including the semiconductor device described in any of the above embodiments are described. FIG. 18 illustrates electronic devices each including the electronic component 4700 including the semiconductor device.

[Mobile Phone]

An information terminal 5500 illustrated in FIG. 18 is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

The semiconductor device described in the above embodiment is employed for the information terminal 5500, whereby the information terminal 5500 can have low power consumption. Furthermore, heat generation from a circuit can be reduced owing to low power consumption; thus, the influence of heat generation on the circuit itself, the peripheral circuit, and the module can be reduced. Thus, the reliability of the information terminal 5500 can be improved.

[Wearable Terminal]

In FIG. 18, a smart watch 5900 is illustrated as an example of a wearable terminal. The smart watch 5900 includes a housing 5901, a display portion 5902, an operation button 5903, an operator 5904, a band 5905, and the like.

As in the information terminal 5500 described above, the semiconductor device described in the above embodiment is employed for the wearable terminal, whereby the wearable terminal can have low power consumption. Furthermore, heat generation from a circuit can be reduced owing to low power consumption; thus, the influence of heat generation on the circuit itself, the peripheral circuit, and the module can be reduced. Thus, the reliability of the wearable terminal can be improved.

[Information Terminal]

A desktop information terminal 5300 is illustrated in FIG. 18. The desktop information terminal 5300 includes a main body 5301 of the information terminal, a display 5302, and a keyboard 5303.

As in the information terminal 5500 described above, the semiconductor device described in the above embodiment is employed for the desktop information terminal 5300, whereby the desktop information terminal 5300 can have low power consumption.

Furthermore, heat generation from a circuit can be reduced owing to low power consumption; thus, the influence of heat generation on the circuit itself, the peripheral circuit, and the module can be reduced. Thus, the reliability of the desktop information terminal 5300 can be improved.

Note that although the smartphone, the smart watch, and the desktop information terminal are illustrated in FIG. 18 as examples of the electronic device, the semiconductor device described in the above embodiment can also be employed for information terminals other than a smartphone, a smart watch, and a desktop information terminal. Examples of an information terminal other than a smartphone, a smart watch, and a desktop information terminal include a PDA (Personal Digital Assistant), a laptop information terminal, and a workstation.

[Household Appliance]

In FIG. 18, an electric refrigerator-freezer 5800 is illustrated as an example of a household appliance. The electric refrigerator-freezer 5800 includes a housing 5801, a refrigerator door 5802, a freezer door 5803, and the like.

The semiconductor device described in the above embodiment is employed for the electric refrigerator-freezer 5800, whereby the electric refrigerator-freezer 5800 can have low power consumption. Furthermore, heat generation from a circuit can be reduced owing to low power consumption; thus, the influence of heat generation on the circuit itself, the peripheral circuit, and the module can be reduced. Thus, the reliability of the electric refrigerator-freezer 5800 can be increased.

Although the electric refrigerator-freezer is described as a household appliance in this example, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

In FIG. 18, a portable game machine 5200 that is as an example of a game machine is illustrated. The portable game machine 5200 includes a housing 5201, a display portion 5202, a button 5203, and the like.

FIG. 18 illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 18, the controller 7522 can include a display portion that displays a game image, and an input interface besides a button, such as a touch panel, a stick, a rotating knob, and a sliding knob, for example. The shape of the controller 7522 is not limited to that in FIG. 18, and the shape of the controller 7522 may be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be displayed with a display device such as a television device, a personal computer display, a game display, or a head-mounted display.

The semiconductor device described in the above embodiment is employed for the portable game machine 5200 or the stationary game machine 7500, whereby the portable game machine 5200 or the stationary game machine 7500 can have low power consumption. Furthermore, heat generation from a circuit can be reduced owing to low power consumption; thus, the influence of heat generation on the circuit itself, the peripheral circuit, and the module can be reduced. Thus, the reliability of the portable game machine 5200 or the stationary game machine 7500 can be increased.

Although FIG. 18 illustrates the portable game machine and the stationary game machine as examples of game machines, the electronic device of one embodiment of the present invention is not limited thereto. Examples of the electronic device of one embodiment of the present invention include an arcade game machine installed in entertainment facilities (e.g., a game arcade and an amusement park), and a throwing machine for batting practice installed in sports facilities.

[Camera]

The semiconductor device described in the above embodiment can be employed for a camera.

A digital camera 6240 is illustrated in FIG. 18. The digital camera 6240 includes a housing 6241, a display portion 6242, operation buttons 6243, a shutter button 6244, and the like. Furthermore, a detachable lens 6246 is attached to the digital camera 6240. Here, the lens 6246 of the digital camera 6240 is detachable from the housing 6241 for replacement; alternatively, the lens 6246 may be incorporated into the housing 6241. A stroboscope, a viewfinder, or the like may be additionally provided in the digital camera 6240.

The semiconductor device described in the above embodiment is employed for the digital camera 6240, whereby the digital camera 6240 can have low power consumption. Furthermore, heat generation from a circuit can be reduced owing to low power consumption; thus, the influence of heat generation on the circuit itself, the peripheral circuit, and the module can be reduced. Thus, the reliability of the digital camera 6240 can be increased.

[Video Camera]

The semiconductor device described in the above embodiment can be employed for a video camera.

A video camera 6300 is illustrated in FIG. 18. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Images displayed on the display portion 6303 may be changed in accordance with the angle at the joint 6306 between the first housing 6301 and the second housing 6302.

The semiconductor device described in the above embodiment is employed for the video camera 6300, whereby the video camera 6300 can have low power consumption. Furthermore, heat generation from a circuit can be reduced owing to low power consumption; thus, the influence of heat generation on the circuit itself, the peripheral circuit, and the module can be reduced. Thus, the reliability of the video camera 6300 can be increased.

[ICD]

The semiconductor device described in the above embodiment can be employed for an implantable cardioverter-defibrillator (ICD).

A schematic cross-sectional view of an example of an ICD is illustrated in FIG. 18. An ICD main unit 5400 includes at least a battery 5401, an electronic component 4700, an antenna 5404, a wire 5402 reaching the right atrium, and a wire 5403 reaching the right ventricle.

The ICD main unit 5400 is implanted in the body by surgery, and the two wires pass through a subclavian vein 5405 and a superior vena cava 5406 of the human body, with the end of one of the wires placed in the right ventricle and the end of the other wire placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor or the like, the number of times the treatment with pacing is performed, and the time taken for the treatment, for example, can be stored.

The antenna 5404 can receive electric power, and the electric power is charged into the battery 5401. When the ICD main unit 5400 includes a plurality of batteries, the safety can be improved. Specifically, even if one of the batteries in the ICD main unit 5400 is dead, the other batteries can work properly; hence, the batteries also function as an auxiliary power source.

Other than the antenna 5404 capable of receiving electric power, an antenna that can transmit physiological signals may be included. For example, a system that monitors the cardiac activity so as to check physiological signals such as a pulse, a respiratory rate, a heart rate, and body temperature with an external monitoring device may be constructed.

The semiconductor device described in the above embodiment is employed for the ICD main unit 5400, whereby the ICD main unit 5400 can have low power consumption. Furthermore, heat generation from a circuit can be reduced owing to low power consumption; thus, the influence of heat generation on the circuit itself, the peripheral circuit, and the module can be reduced. Thus, the reliability of the ICD main unit 5400 can be improved.

[Use in Space]

The semiconductor device described in the above embodiment can also be employed for a device used in space.

An artificial satellite 6800 is illustrated in FIG. 18. The artificial satellite 6800 includes a body 6801, a solar panel 6802, and an antenna 6803.

When the solar panel 6802 is irradiated with sunlight, electric power required for operation of the artificial satellite 6800 is generated. However, in the situation where the solar panel is not irradiated with sunlight or the situation where the amount of sunlight with which the solar panel is irradiated is small, the amount of generated electric power is reduced. Accordingly, a sufficient amount of electric power required for operation of the artificial satellite 6800 might not be generated. In order for the artificial satellite 6800 to operate even in the situation with a small amount of generated electric power, for example, it is considered to provide a battery in the artificial satellite 6800. However, an increase in the battery capacity increases the battery weight, which accordingly leads to an increase in the weight of the artificial satellite 6800 in which the battery is provided. This might increase the cost of launch of the artificial satellite 6800 from the ground, for example.

The semiconductor device employed for the artificial satellite 6800 can generate a signal, for example. The signal is transmitted through the antenna 6803, and can be received by a ground-based receiver or another artificial satellite, for example. When the signal transmitted by the artificial satellite 6800 is received, the position of a receiver that receives the signal can be measured, for example. Thus, the artificial satellite 6800 can construct a satellite positioning system, for example.

Alternatively, a semiconductor device employed for the artificial satellite 6800 can include a sensor, for example. For example, with a structure including a visible light sensor, the artificial satellite 6800 can have a function of sensing sunlight reflected by a ground-based object. Alternatively, with a structure including a thermal infrared sensor, the artificial satellite 6800 can have a function of sensing thermal infrared rays emitted from the surface of the earth. Thus, the artificial satellite 6800 can function as an earth observing satellite, for example.

As described above, the semiconductor device described in the above embodiment is a semiconductor device with low power consumption. Thus, the semiconductor device described in the above embodiment is employed for the artificial satellite 6800, whereby the power consumption of the artificial satellite 6800 can be reduced. Consequently, a large-capacity battery does not need to be provided in the artificial satellite 6800, reducing the weight of the artificial satellite 6800. Accordingly, the cost of launch of the artificial satellite 6800 from the ground can be reduced, for example.

In addition, in space, in a region irradiated with sunlight, the semiconductor device or the like provided in the artificial satellite 6800 is exposed to a high-temperature environment of 200° C. or higher in some cases. The semiconductor device described in the above embodiment has high reliability even in a high-temperature environment. Thus, when the semiconductor device of one embodiment of the present invention is employed for the artificial satellite 6800, the reliability of the artificial satellite 6800 can be increased.

This embodiment can be implemented in an appropriate combination with the structures described in the other embodiments and the like.

[Example 1]

In this example, the simulation result of operation of the semiconductor device of one embodiment of the present invention is described.

Figure 19:
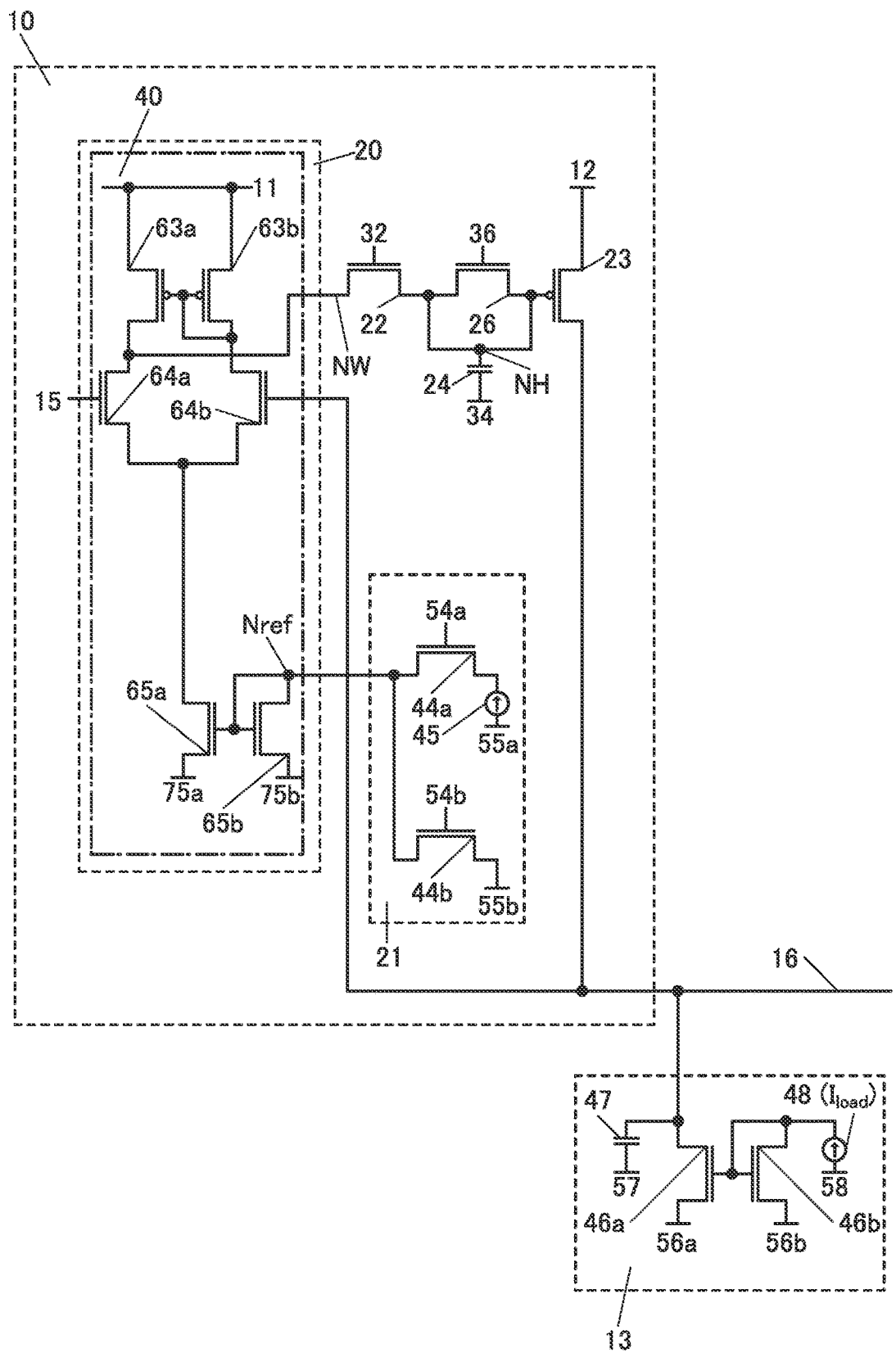
FIG. 19 is a circuit diagram illustrating a structure of a semiconductor device of Example.

FIG. 19 is a circuit diagram illustrating a structure of a circuit assumed in this example. In this example, a circuit including the semiconductor device 10 having the structure illustrated in FIG. 6 and a load circuit 13 provided outside the semiconductor device 10 and electrically connected to the wiring 16 was assumed, and the circuit was operated by the method shown in FIG. 8 in a simulation.

The load circuit 13 included a transistor 46a, a transistor 46b, a capacitor 47, and a current source 48. One of a source and a drain of the transistor 46a and one electrode of the capacitor 47 were electrically connected to the wiring 16. The other electrode of the capacitor 47 was electrically connected to a wiring 57. The other of the source and the drain of the transistor 46a was electrically connected to a wiring 56a. A gate of the transistor 46a was electrically connected to a gate of the transistor 46b. The gate of the transistor 46b was electrically connected to one of a source and a drain of the transistor 46b. The one of the source and the drain of the transistor 46b was electrically connected to one electrode of the current source 48. The other electrode of the current source 48 was electrically connected to a wiring 58. The other of the source and the drain of the transistor 46b was electrically connected to a wiring 56b.

The potential of the wiring 11 was set to 3.3 V, the capacitance value of the capacitor 24 was set to 1 pF, the current value of the current source 45 was set to 0.1 μA, the capacitance value of the capacitor 47 was set to 1 μF, and the current value of the current source 48 was set to 1 μA. The potentials of the wiring 34, the wiring 55a, the wiring 55b, the wiring 56a, the wiring 56b, the wiring 57, the wiring 58, the wiring 75a, and the wiring 75b were set to ground potentials. On the assumption of the above conditions, the operation of the semiconductor device 10 of the case where a reference potential of 1.2 V was supplied to the wiring 15 was examined by simulation.

Figure 20A:
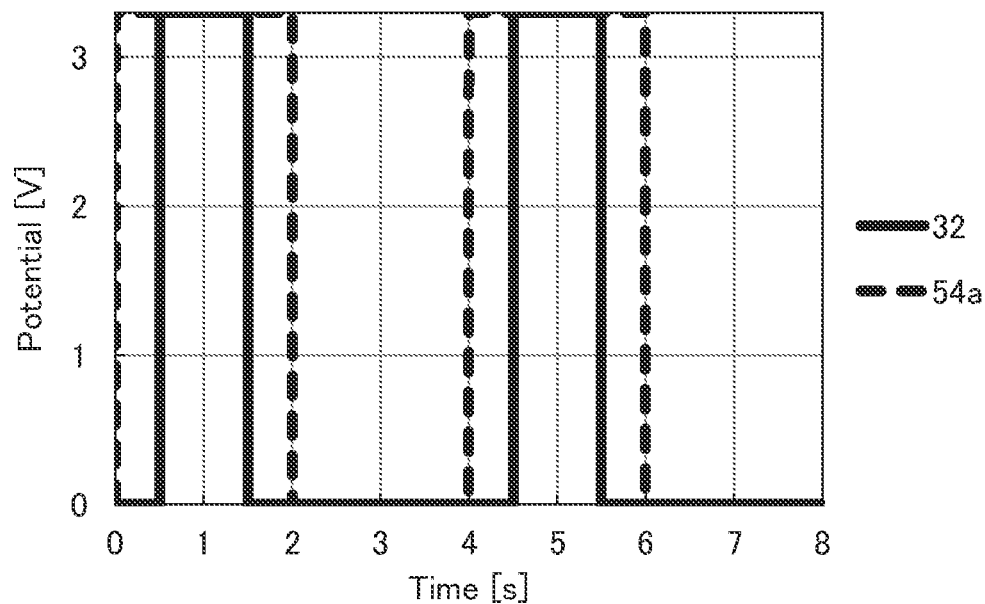
FIG. 20A and FIG. 20B are graphs showing simulation results of Example.
Figure 20B:
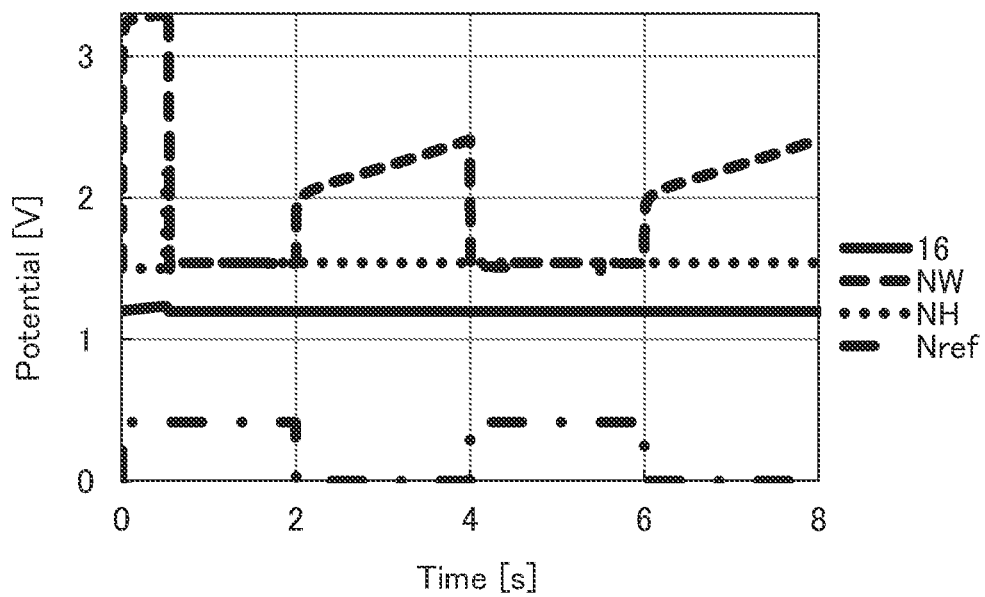

FIG. 20A is a graph showing changes in the potentials of the wiring 32 and the wiring 54a over time. FIG. 20B is a graph showing changes in the potentials of the wiring 16, the node NW, the node NH, and the node Nref over time. Here, in the simulation, an operation corresponding to that from Time T1 to Time T2 was performed from 0.0 s to 0.5 s; an operation corresponding to that from Time T2 to Time T3 was performed from 0.5 s to 1.5 s; an operation corresponding to that from Time T3 to Time T4 was performed from 1.5 s to 2.0 s; and an operation corresponding to that from Time T4 to Time T5 was performed from 2.0 s to 4.0 s. Furthermore, in the simulation, an operation corresponding to that from Time T1 to Time T2 was performed from 4.0 s to 4.5 s; an operation corresponding to that from Time T2 to Time T3 was performed from 4.5 s to 5.5 s; an operation corresponding to that from Time T3 to Time T4 was performed from 5.5 s to 6.0 s; and an operation corresponding to that from Time T4 to Time T5 was performed from 6.0 s to 8.0 s.

As shown in FIG. 20B, it was confirmed in the simulation that the potential of the wiring 16 became substantially the same as 1.2 V that was the potential of the wiring 15, and the semiconductor device 10 was able to continuously output a desired potential.

[Example 2]

In this example, the simulation result of operation of the semiconductor device of one embodiment of the present invention is described.

Figure 21:
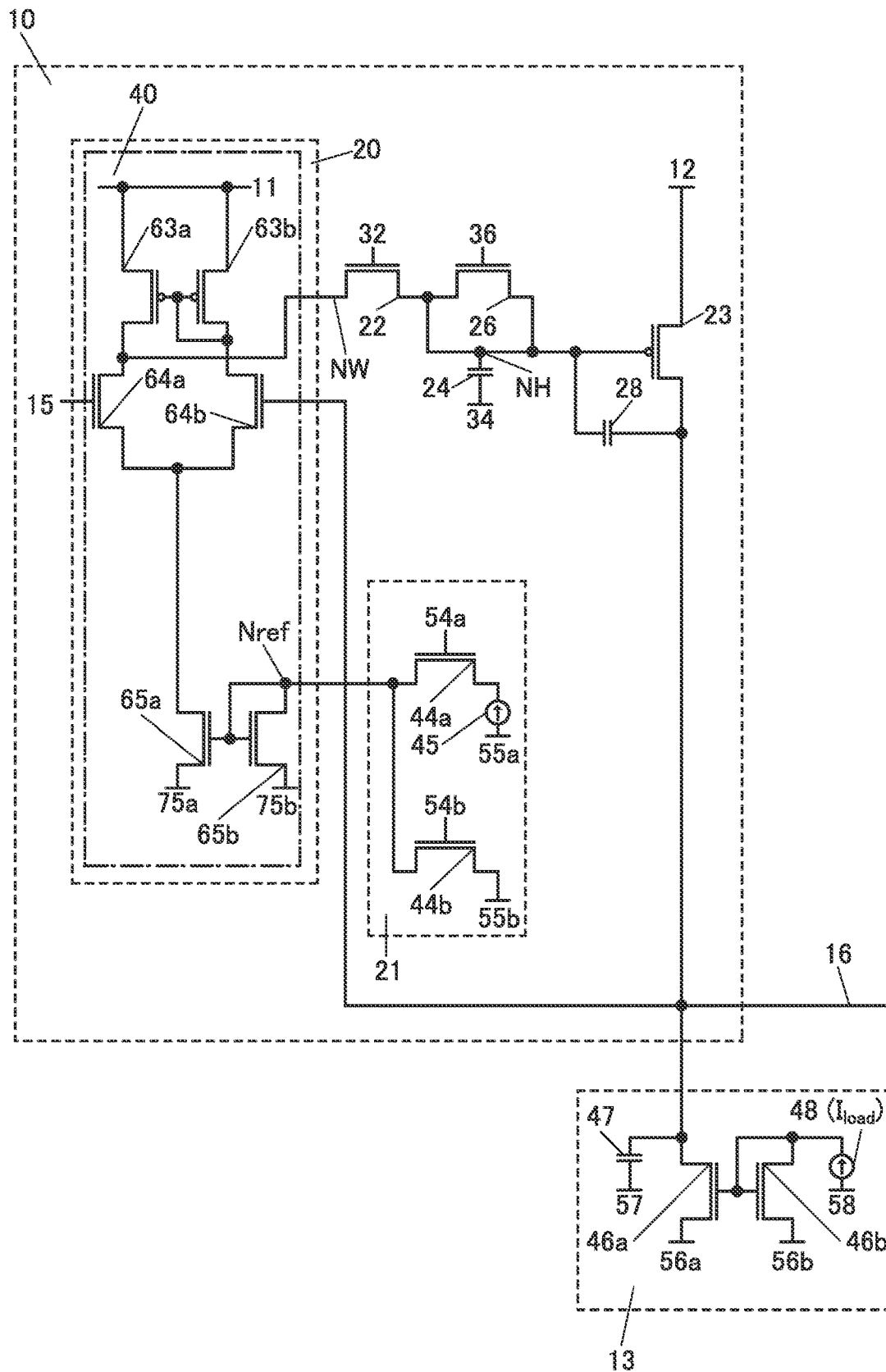
FIG. 21 is a circuit diagram illustrating a structure of a semiconductor device of Example.

In this example, the semiconductor device 10 having the structure illustrated in FIG. 19 and the semiconductor device 10 having a structure illustrated in FIG. 21 were assumed and operated by the method shown in FIG. 8 in a simulation. FIG. 21 illustrates a structure in which the load circuit 13 having the structure illustrated in FIG. 19 is provided outside the semiconductor device 10 having the structure illustrated in FIG. 7 and the load circuit 13 is electrically connected to the wiring 16.

Here, the potential of the wiring 11 was set to 3.3 V, the capacitance value of the capacitor 24 was set to 1 pF, the current value of the current source 45 was set to 0.1 µA, and the capacitance value of the capacitor 47 was set to 1 µF. The potentials of the wiring 34, the wiring 55a, the wiring 55b, the wiring 56a, the wiring 56b, the wiring 57, the wiring 58, the wiring 75a, and the wiring 75b were set to ground potentials. A reference potential of 1.2 V was supplied to the wiring 15. On the assumption of the above conditions, a change in the potential of the wiring 16 over time was calculated with current $I_{load}$, a current value of current flowing through the current source 48, set to 0.20 µA, 0.40 µA, 0.60 µA, 0.80 µA, 0.90 µA, 0.92 µA, 0.94 µA, 0.96 µA, 0.98 µA, 1.00 µA, 1.02 µA, 1.04 µA, 1.06 µA, 1.08 µA, 1.10 µA, 1.20 µA, 1.40 µA, 1.60 µA, 1.80 µA, and 2.00 µA.

Figure 22A:
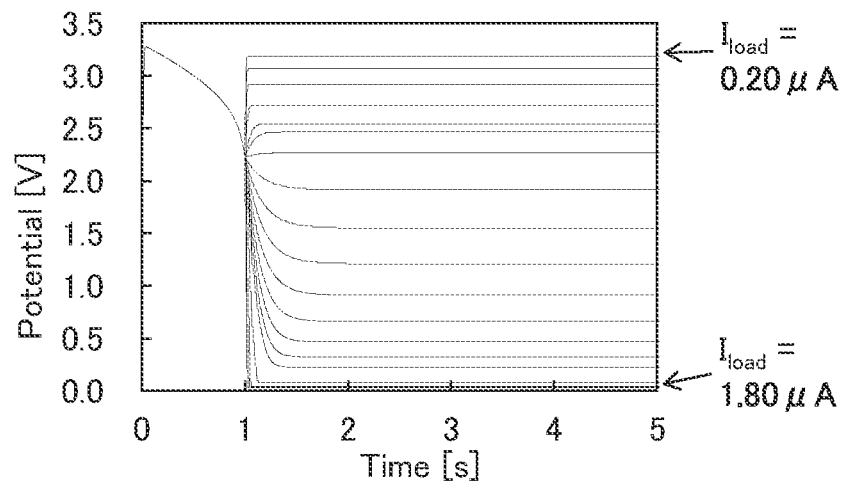
FIG. 22A to FIG. 22C are graphs showing simulation results of Example.
Figure 22B:
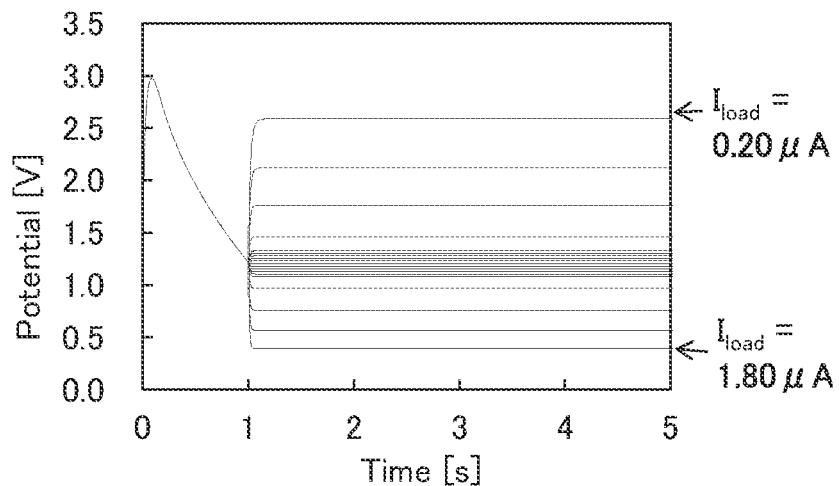
Figure 22C:
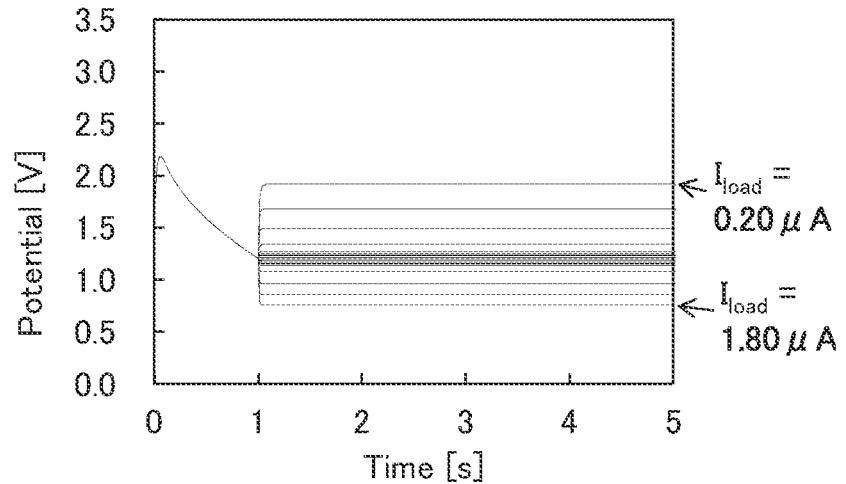

FIG. 22A shows calculation results of a change in the potential of the wiring 16 over time in the case where the semiconductor device 10 has the structure illustrated in FIG. 19. FIG. 22B shows calculation results of a change in the potential of the wiring 16 over time in the case where the semiconductor device 10 has the structure illustrated in FIG. 21 and the capacitance value of the capacitor 28 is 1 pF. FIG. 22C shows calculation results of a change in the potential of the wiring 16 over time in the case where the semiconductor device 10 has the structure illustrated in FIG. 21 and the capacitance value of the capacitor 28 is 10 pF.

As shown in FIG. 22A to FIG. 22C, it was confirmed in the simulation that a larger current $I_{load}$ reduced the potential of the wiring 16. In addition, it was confirmed in the simulation that a change in the potential of the wiring 16 due to a change in the current $I_{load}$ was reduced with the capacitor 28 provided in the semiconductor device 10. Furthermore, it was also confirmed in the simulation that a larger capacitance value of the capacitor 28 further reduced the change in the potential of the wiring 16 due to the change in the current $I_{load}$.

REFERENCE NUMERALS

10: semiconductor device, 11: wiring, 12: wiring, 13: load circuit, 15: wiring, 16: wiring, 20: control circuit, 21: power switch circuit, 22: transistor, 23: transistor, 24: capacitor, 26: transistor, 28: capacitor, 32: wiring, 34: wiring, 36: wiring, 40: operational amplifier circuit, 41: transistor, 42: transistor, 44a: transistor, 44b: transistor, 45: current source, 46a: transistor, 46b: transistor, 47: capacitor, 48: current source, 51: wiring, 52: wiring, 54a: wiring, 54b: wiring, 55a: wiring, 55b: wiring, 56a: wiring, 56b: wiring, 57: wiring, 58: wiring, 63a: transistor, 63b: transistor, 64a: transistor, 64b: transistor, 65a: transistor, 65b: transistor, 75a: wiring, 75b: wiring, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 402: insulator, 404: insulator, 500: transistor, 503: conductor, 503a: conductor, 503b: conductor, 510: insulator, 512: insulator, 514: insulator, 516: insulator, 518: conductor, 520: insulator, 522: insulator, 524: insulator, 530: oxide, 530a: oxide, 530b: oxide, 530c: oxide, 530c1: oxide, 530c2: oxide, 540a: conductor, 540b: conductor, 542: conductor, 542a: conductor, 542b: conductor, 543a: region, 543b: region, 544: insulator, 546: conductor, 548: conductor, 550: insulator, 552: insulator, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 640: insulator, 4700: electronic component, 4701: lead, 4702: printed circuit board, 4704: mounting board, 4710: semiconductor device, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5200: portable game machine, 5201: housing, 5202: display portion, 5203: button, 5300: desktop information terminal, 5301: main body, 5302: display, 5303: keyboard, 5400: ICD main unit, 5401: battery, 5402: wire, 5403: wire, 5404: antenna, 5405: subclavian vein, 5406: superior vena cava, 5500: information terminal, 5510: housing, 5511: display portion, 5800: electric refrigerator-freezer, 5801: housing, 5802: refrigerator door, 5803: freezer door, 5900: smart watch, 5901: housing, 5902: display portion, 5903: operation button, 5904: operator, 5905: band, 6240: digital camera, 6241: housing, 6242: display portion, 6243: operation button, 6244: shutter button, 6246: lens, 6300: video camera, 6301: housing, 6302: housing, 6303: display portion, 6304: operation key, 6305:

lens, 6306: connection portion, 6800: artificial satellite, 6801: body, 6802: solar panel, 6803: antenna, 7500: stationary game machine, 7520: main body, 7522: controller.

The invention claimed is:

1. A semiconductor device comprising an operational amplifier circuit, a first transistor, a second transistor, a third transistor, and a capacitor,
    wherein an output terminal of the operational amplifier circuit is electrically connected to one of a source and a drain of the first transistor,
    wherein the other of the source and the drain of the first transistor is electrically connected to a gate of the second transistor,
    wherein one of a source and a drain of the third transistor is electrically connected to the other of the source and the drain of the first transistor,
    wherein the other of the source and the drain of the third transistor is electrically connected to the gate of the second transistor, and
    wherein one electrode of the capacitor is electrically connected to the source and the drain of the third transistor.

2. The semiconductor device according to claim 1,
    wherein one of a source and a drain of the second transistor is electrically connected to an input terminal of the operational amplifier circuit.

3. The semiconductor device according to claim 1,
    wherein a first signal is supplied to a gate of the first transistor,
    wherein a second signal is supplied to a gate of the third transistor, and
    wherein the first signal and the second signal are complementary signals.

4. The semiconductor device according to claim 1,
    wherein the first transistor comprises a metal oxide in a channel formation region.

5. An electronic device comprising the semiconductor device according to claim 4, and a housing.

6. An artificial satellite comprising the semiconductor device according to claim 4, and a solar panel.

7. A semiconductor device comprising an operational amplifier circuit, a first transistor, a second transistor, a third transistor, a fourth transistor, a fifth transistor, a capacitor, and a current source,
    wherein an output terminal of the operational amplifier circuit is electrically connected to one of a source and a drain of the first transistor,
    wherein the other of the source and the drain of the first transistor is electrically connected to a gate of the second transistor,
    wherein a first power source terminal of the operational amplifier circuit is electrically connected to one of a source and a drain of the third transistor,
    wherein the first power source terminal of the operational amplifier circuit is electrically connected to one of a source and a drain of the fourth transistor,
    wherein the other of the source and the drain of the third transistor is electrically connected to the current source,
    wherein the other of the source and the drain of the fourth transistor is electrically connected to a power supply line,
    wherein one of a source and a drain of the fifth transistor is electrically connected to the other of the source and the drain of the first transistor,
    wherein the other of the source and the drain of the fifth transistor is electrically connected to the gate of the second transistor, and
    wherein one electrode of the capacitor is electrically connected to the source and the drain of the fifth transistor.

8. The semiconductor device according to claim 7,
    wherein one of a source and a drain of the second transistor is electrically connected to an input terminal of the operational amplifier circuit.

9. The semiconductor device according to claim 7,
    wherein the first transistor comprises a metal oxide in a channel formation region.

10. An electronic device comprising the semiconductor device according to claim 9, and a housing.

11. An artificial satellite comprising the semiconductor device according to claim 9, and a solar panel.

12. The semiconductor device according to claim 7,
    wherein a first signal is supplied to a gate of the first transistor,
    wherein a second signal is supplied to a gate of the fifth transistor,
    wherein a third signal is supplied to a gate of the third transistor,
    wherein a fourth signal is supplied to a gate of the fourth transistor,
    wherein the first signal and the second signal are complementary signals, and
    wherein the third signal and the fourth signal are complementary signals.

\* \* \* \* \*